(12) United States Patent
Kim

(10) Patent No.: US 7,675,768 B1
(45) Date of Patent: Mar. 9, 2010

(54) LOW POWER CARBON NANOTUBE MEMORY

(75) Inventor: Juhan Kim, San Jose, CA (US)

(73) Assignee: Fronteon Inc, San Jose, CA (US)

( * ) Notice: Subject to any disclaimer, the term of this patent is extended or adjusted under 35 U.S.C. 154(b) by 83 days.

(21) Appl. No.: 12/197,210

(22) Filed: Aug. 22, 2008

(51) Int. Cl.
*G11C 11/24* (2006.01)

(52) U.S. Cl. ............. 365/149; 365/189.05; 365/189.15; 365/207

(58) Field of Classification Search .................. 365/149, 365/189.05, 195.15, 207
See application file for complete search history.

(56) References Cited

U.S. PATENT DOCUMENTS 7,112,493 B2 * 9/2006 Bertin et al. ................. 438/275
7,113,426 B2 9/2006 Rueckes et al.
7,115,901 B2 10/2006 Bertin et al.

* cited by examiner

*Primary Examiner*—Hoai V Ho
*Assistant Examiner*—Jason Lappas

(57) ABSTRACT

Low power carbon nanotube memory is realized such that a first dynamic circuit serves as a local sense amp for reading a memory cell through a lightly loaded local bit line, a second dynamic circuit serves as a segment sense amp for reading the local sense amp, a first tri-state inverter serves as an inverting amplifier of a global sense amp, and a second tri-state inverter serves as a bypass circuit for bypassing output from previous memory block. When reading, a voltage difference in the local bit line is converted to a time difference for differentiating high data and low data by the sense amps for realizing low power with dynamic operation. In particular, amplify transistor of the sense amps is composed of relatively long channel transistor for reducing turn-off current. And buffered data path is used for achieving fast data transfer. Additionally, alternative circuits and memory cell structures are described.

20 Claims, 12 Drawing Sheets

| nsdata | sdata | cdata | ncdata | Match line | Result |
|---|---|---|---|---|---|
| 0 | 0 | x | x | High | Match |
| 1 | 0 | 1 | 0 | Low | Mis-match |
| 1 | 0 | 0 | 1 | High | Match |
| 0 | 1 | 1 | 0 | High | Match |
| 0 | 1 | 0 | 1 | Low | Mis-match |

FIG. 7A    6F² Cell

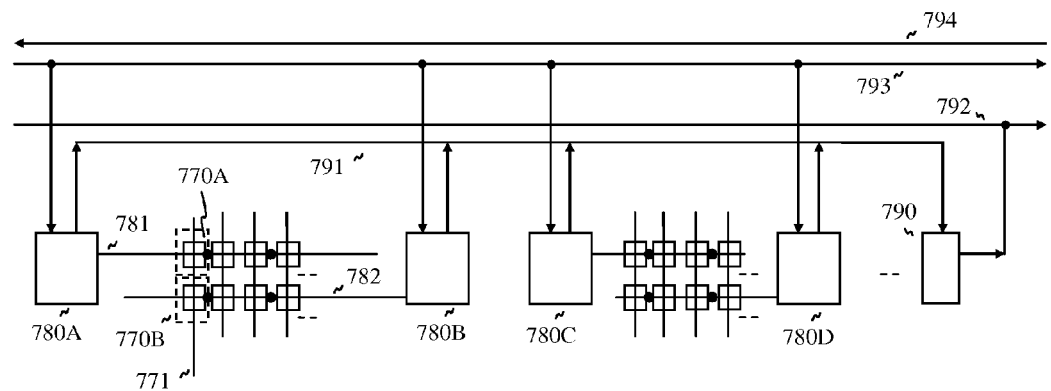
FIG. 7F
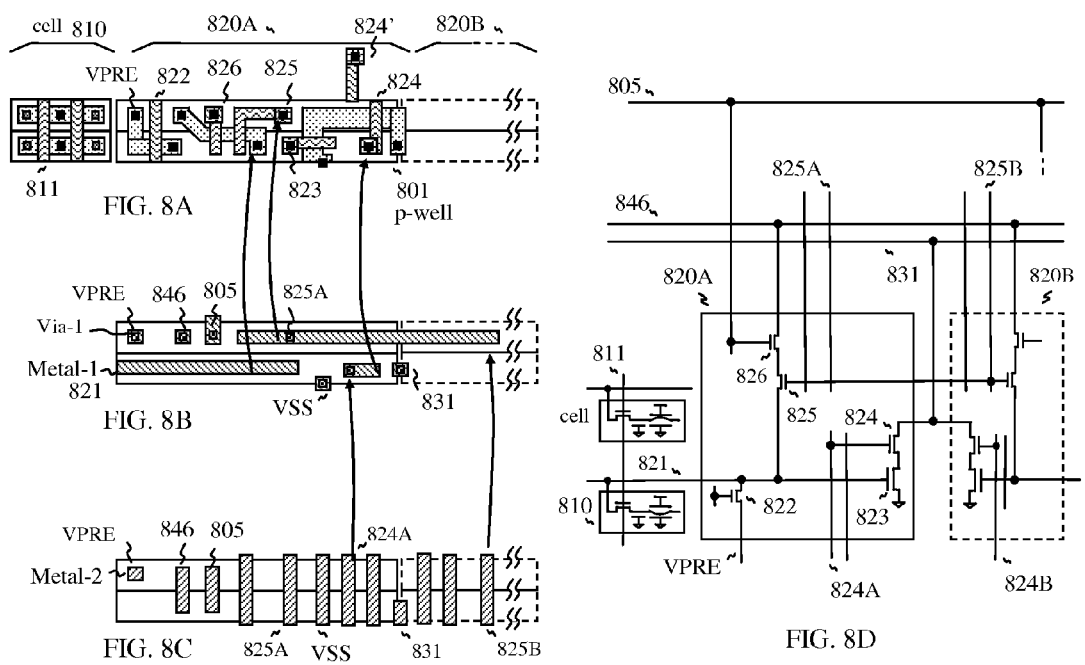
FIG. 8A
FIG. 8B
FIG. 8C
FIG. 8D

LOW POWER CARBON NANOTUBE MEMORY

FIELD OF THE INVENTION

The present invention relates generally to integrated circuits, in particular to low power carbon nanotube memory.

BACKGROUND OF THE INVENTION

Carbon nanotube has been demonstrated to have remarkable physical, electrical and thermal properties, and is likely to find numerous applications such as a high-speed and high-density nonvolatile memory. In order to store data, the carbon nanotube is bended to one of two electrodes, which exhibits high voltage or low voltage depending on the bended carbon nanotube.

In FIG. 1A, a prior art of carbon nanotube-based memory circuit including carbon nanotube and sense amplifier is illustrated, as published, U.S. Pat. No. 7,112,493, U.S. Pat. No. 7,115,901 and U.S. Pat. No. 7,113,426. The memory cell 130 is consisted of MOS transfer transistor 132 and carbon nanotube storage element (NT). The transfer gate 132, the drain/source 134 and 135 configure MOS transistor. And storage node (SN), reference node (REF) and release node (RN) configure the storage element. The storage node (SN) is connected to drain/source region 134 of the MOS transistor, carbon nanotube (NT) is connected to reference node (REF), and release node is connected to release line (RL). The word line 131 is connected to the gate 132, and the bit line 136 is connected to the drain/source 135. The bit line 136 is also connected to a sense amplifier 137. The sense amplifier 137 compares the difference of the voltage (or current) between that of bit line 136 and voltage reference (VREF).

The carbon nanotube stores binary states, such as the ON state shown in FIG. 1B and the OFF state shown in FIG. 1C. A small parasitic capacitance exists between SN 151, NT 152 and RN 153. In the ON state as shown in FIG. 1B, NT 152 is flexed and held in close proximity to SN 151 by van der Waals forces, resulting in an ohmic resistance typically in the 1 K to 100 K ohm range between NT 152 and SN 151. In FIG. 1C, the OFF state has a bended NT 152 on node RN 153, which results in an open circuit, between NT 152 and SN 151. In order to read the stored data "1" (on state), the word line 131 in FIG. 1A is asserted to high level. Thus the bit line 136 is changed by the bended NT 152 as shown in FIG. 1B through MOS access transistor, and then the sense amplifier 137 compares the result with VREF, which is data "1". In contrast, the bit line 136 is not changed because the storage node SN 151 is isolated from NT 152 when the stored data is "0" (off state), and then the sense amplifier compares the result with VREF, which is data "0".

Even though the carbon nanotube is ultra fast (100 G~200 GHz), the access time is mostly determined by the read path through the MOS (Metal Oxide Semiconductor) access transistor and bit line, which path includes contact resistance between carbon nanotube and an electrode. Furthermore, for sensing the bit line voltage without sensing error, the sense amplifier has waiting time until the bit line is changed and reached to enough voltage from pre-charged voltage, such as 100 mV~200 mV. In the large memory array, the charging time (or discharging time) is relatively longer than that of decoding time because the bit line has heavy RC loading with multiple memory cells. Total resistance includes the contact resistance of the bended carbon nanotube, turn-on resistance of MOS access transistor, and resistance of the bit line. Additionally, cell-to-cell and wafer-to-wafer variations affect the sensing time. Hence, the sensing time depends on total resistance and total capacitance of the bit line. Furthermore, the storage node (SN) may be coupled by the word line and adjacent signals, such that gate capacitance of the MOS access transistor couples the storage node when reading and writing, which may cause to lose the stored data when the coupling voltage is high, because there is almost no capacitance in the storage node of the carbon nanotube memory cell, while the conventional memory has enough capacitance for DRAM or a strong latch for SRAM. And the conventional DRAM (Dynamic Random Access Memory) stores voltage data in a relatively big capacitor (20 f-30 fF) and the conventional SRAM (Static Random Access Memory) stores voltage data in a strong latch circuit. Moreover, bit line swing is limited by the total resistance including contact resistance of the carbon nanotube and the turn-on resistance of the MOS access transistor. And the conventional sense amplifier is consisted of relatively long channel transistors in order to compensate threshold voltage variation of the amplify transistors, which makes the sensing speed slow and increases the chip area.

In terms of array architecture, a write data line (not shown) is connected to the sense amp. Conventionally, the write data line is heavily loaded with no buffers, so that the write data line always drives full length of the memory bank, which increases driving current and RC delay time. For reading data, a read data line (not shown) is connected to the sense amp with full length of the memory bank as well. Alternatively, a pair of data lines can be used typically for writing data and amplifying the stored data. Moreover, access time is different from location of the selected memory cell. For example, access time from the sense amp near a data output circuit is faster than that of the sense amp far from the data output circuit, so that it is difficult to latch the sense amp output at high speed, because a latching clock is fixed (not shown). Furthermore, the read data line is also heavily loaded for connecting to multiple memory blocks with no buffers, which increases driving current and RC delay time as well.

In this respect, there is still a need for improving the carbon nanotube memory, such that a memory circuit should be re-invented for reading and writing data in the suspended carbon nanotube, which achieves fast access and stable operation. In the present invention, low power carbon nanotube memory is realized, and a buffered data path is used for writing and reading data, Furthermore, the bit lines are multi-divided to reduce the parasitic capacitance of the bit line. For reading the divided bit line more effectively, multi-stage sense amps are used, such that a local sense amp includes four to five transistors to insert into the memory array. And a time-domain sensing scheme is introduced, in order to differentiate data "1" and data "0" in a time-domain, and which does not require the conventional sense amp. Alternatively, a decoupling capacitor is added to a storage node of the carbon nanotube memory cell in order to reduce the coupling effect during read and write.

The memory cell can be formed on the surface of the wafer. And the steps in the process flow should be compatible within the current CMOS manufacturing environment with additional steps for forming carbon nanotube storage element. Alternatively, the memory cell can be formed from thin film polysilicon layer, because the lightly loaded bit line can be quickly discharged by the memory cell even though the thin film pass transistor can flow relatively low current. In doing so, multi-stacked memory is realized with thin film transistor, which can increase the density within the conventional CMOS process with additional process steps, because the conventional CMOS process is reached to a scaling limit for fabricating transistors on a surface of a wafer. In particular, a body-tied TFT (Thin Film Transistor) transistor can be alternatively used as the thin film transistor for alleviating self heating problem of short channel TFT. In doing so, multi-stacked memory is realized with short channel TFT transistor.

SUMMARY OF THE INVENTION

For realizing low power carbon nanotube memory, bit lines are multi-divided, so that multi-stage sense amps are used to read the memory cell through the divided local bit lines. In particular, amplifying transistors of the sense amps are composed of relatively long channel transistors than those of pre-charge transistors in order to reduce turn-off current, which reduces operating power. Furthermore, the multi-stage sense amps are composed of dynamic circuits for eliminating static current when reading, wherein the multi-stage sense amps include a local sense amp configuring a first dynamic circuit for reading the memory cell through a local bit line, a segment sense amp configuring a second dynamic circuit for reading the local sense amp through a segment bit line, and a global sense amp configuring a first tri-state inverter for reading the segment sense amp through a global bit line, while a second tri-state inverter is used for bypassing an output from a previous memory block, which configures a data transfer circuit with a read inverter. With multi-stage sense amp, access time is improved because each sense amp drives lightly loaded bit lines, such that the memory cell drives very light local bit line, the local sense amp drive the segment bit line for transferring a read output to the segment sense amp, the segment sense amp drive the global bit line for transferring the read output to the global sense amp, and the global sense amp drives a common line of the data transfer circuit for transferring the read output to an output latch circuit.

And a buffered data path is used for writing and reading a data, wherein a forwarding write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed. Additionally, a column decoder signal is added for selecting columns in bit line direction, which realizes page mode operation.

Furthermore, configuring memory is more flexible, such that multiple memory macros can be easily configured with small segmented memory array and multi-stage sense amps, instead of big macro with the conventional sense amps. And number of sense amps can be determined by the target speed. For example, high speed application needs more segmented array with more sense amps, while high density application needs more memory cells with reduced number of sense amps, thus cell efficiency is increased.

In order to match the width of the local sense amp with the memory cell, a left local sense amp is placed on the left side and a right local sense amp is placed on the right side. And the segment sense amps are also fit with two memory cells. One of prime advantages is that the local sense amp occupies small area with four transistors, and the segment sense amp is even smaller than the local sense amp with three transistors only.

And write circuits are included in the local sense amp. And the global sense amp is shared by eight columns, and also output multiplexer circuit is included in the global sense amp. As a result, the chip area is reduced by replacing the conventional sense amp with multi-stage sense amps. In contrast, conventional architecture needs more area for adding differential amplifier. And also the differential amplifier occupies more space for connecting common nodes of cross coupled transistor pairs which require a balance for matching threshold voltage with non-minimum transistors. Furthermore, the local sense amp has high gain with wider channel MOS transistor than that of the memory cell, and the segment sense amp has higher gain than that of the local sense amp, which realizes fast read operation.

During read operation, position of a bended carbon nanotube is not changed because attracting force is generated from the local bit line (pre-charged near half VDD voltage) to the bended carbon nanotube node which is contacted to VDD (supply) electrode or VSS (ground) electrode, which does not require write-back operation and refresh operation. Furthermore, the position of the carbon nanotube is not changed after power is turned off, which realizes nonvolatile memory.

Furthermore, with light bit line architecture, bit lines are multi-divided into short local bit lines to reduce parasitic loading. Thus the local bit line is lightly loaded. In doing so, the light bit line is quickly charged or discharged when reading and writing, which realizes fast operation. When reading, a stored data in a memory cell is transferred to an output latch circuit through multi-stage sense amps such that high data is transferred to the output latch circuit with high gain, but low data is not transferred with low gain. By the sense amps, a voltage difference in the bit line is converted to a time difference as an output of the global sense amp with gain. In this manner, a time-domain sensing scheme is realized to differentiate high data and low data stored in the memory cell. For instance, high data is quickly transferred to an output latch circuit through the sense amps with high gain, but low data is rejected by a locking signal based on high data as a reference signal.

More specifically, a reference signal is generated by one of fast changing data with high gain from reference cells, which signal serves as a reference signal to generate a locking signal for the output latch circuit in order to reject latching another data which is slowly changed with low gain, such that high voltage data is arrived first while low voltage data is arrived later, or low voltage data is arrived first while high voltage data is arrived later depending on configuration. The time-domain sensing scheme effectively differentiates high voltage data and low voltage data with time delay control, while the conventional sensing scheme is current-domain or voltage-domain sensing scheme with a heavy bit line pair. There are many advantages to realize the time-domain sensing scheme, so that the sensing time is easily controlled by a tunable delay circuit, which compensates cell-to-cell variation and wafer-to-wafer variation, such that there is a need for adding a delay time before locking the output latch circuit with a statistical data for all the memory cells, such as mean time between fast data and slow data. Thereby the tunable delay circuit generates a delay for optimum range of locking time. And the read output from the memory cell is transferred to the output latch circuit through a returning read path, thus the access time is equal regardless of the location of the selected memory cell, which is advantageous to transfer the read output to the external pad at a time.

Furthermore, the current flow of the pass transistor of the memory cell can be reduced because the pass transistor only drives a lightly loaded local bit line, which means that the pass transistor can be miniaturized further. Moreover, the present invention realizes multi-stacked memory cell structure including thin film transistor because the memory cell only drives lightly loaded bit line even though thin film polysilicon transistor can flow lower current, for example, around 10 times lower. Thereby, bit line loading is reduced around 10 times lower for compensating the low current drivability of the pass transistor. There are almost no limits to stack multiple memory cells as long as the flatness is enough to accumulate the memory cell.

Furthermore, various alternative configurations are described for implementing the multi-stage sense amps, and an example application for content addressable memory is described. And, example memory cell layout and cross sectional views are illustrated to minimize cell area. And the fabrication method is compatible with the conventional CMOS process for realizing planar memory cell including the single-crystal-based regular transistor. And alternatively, additional steps are required for adding the amplify transistor as the segment sense amp, thin film transistors for forming the memory cell and for stacking the memory cells. And the memory cell can be formed from various semiconductor materials, such as silicon-germanium and germanium.

With lightly loaded bit line, cell-to-cell variation is reduced as well when reading, such that a stored voltage in the memory cell is quickly transferred to the bit line with reduced time constant because bit line capacitance is reduced even though contact resistance of the suspended carbon nanotube and turn-on resistance of a pass transistor of the memory cell are not reduced. And in order to improve read operation, a decoupling capacitor is added to a storage node of the memory cell, which reduces gate coupling. Without the decoupling capacitor, the stored data may be lost when the coupling voltage is high, because there is almost no capacitance in the storage node of the memory cell, while the conventional memory has enough capacitance for DRAM or a strong latch for SRAM. And also the capacitor serves as a storage capacitor for the read operation, such that the capacitor slightly charges/discharges the bit line, when the word line is asserted. After then the carbon nanotube fully charges/discharges the bit line through one of two electrodes. Furthermore, the capacitor can reduce soft error when alpha ray and other rays hit the storage node.

Still furthermore, for forming the decoupling capacitor for the storage node of the memory cell, various capacitors can be used. And PIP (Polysilicon Insulator Polysilicon) capacitor structure and MIM (Metal Insulator Metal) capacitor structure can be used for forming the capacitor. And, various capacitors can be used as the capacitor, such as silicon dioxide, silicon nitride, Ta2O5, TiO2, Al2O3, TiN/HfO2/TiN (TIT), and Ru/Insulator/TiN(RIT).

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIGS. 7A, 7B, 7C and 7D illustrate alternative memory cell layout for configuring open bit line cell array, FIG. 7F illustrates block diagram for the open bit line cell array, according to the teachings of the present invention.

FIGS. 8A, 8B and 8C illustrate an example layout for the local sense amp, and FIG. 8D illustrates schematic for related local sense amp, according to the teachings of the present invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1A:
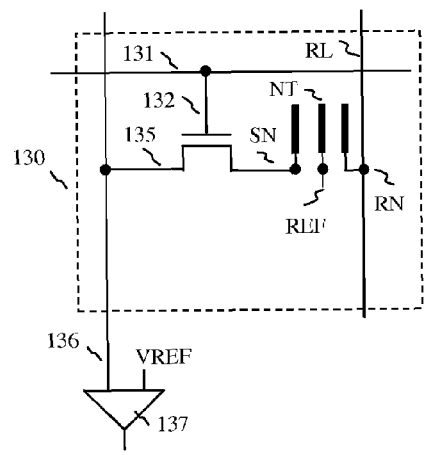
FIG. 1A illustrates a prior art of carbon nanotube memory.
Figure 1B:
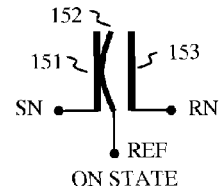
FIG. 1B illustrates "on" state of the carbon nanotube storage element as a prior art.
Figure 1C:
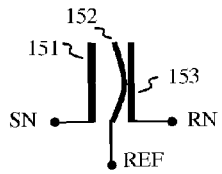
FIG. 1C illustrates "off" state of the carbon nanotube storage element as a prior art.
Figure 2A:
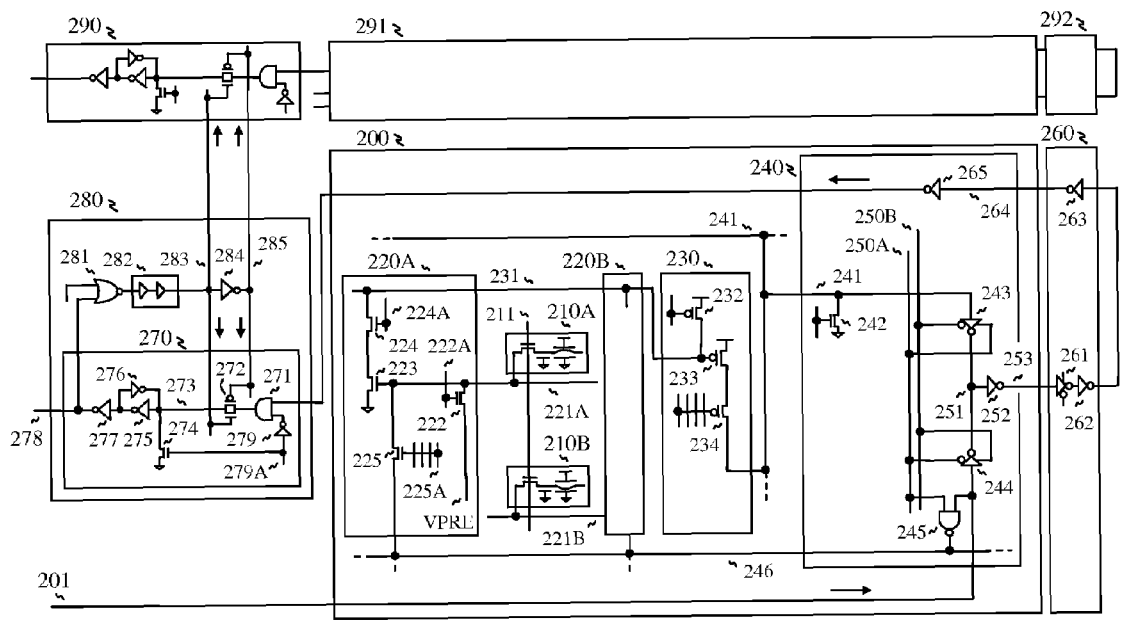
FIG. 2A illustrates a carbon nanotube memory including a buffered data path.

The present invention is directed to low power carbon nanotube memory as shown in FIG. 2A, wherein a memory block 200 comprises memory cells 210A and 210B, a left local sense amp 220A, a right local sense amp 220B, a segment sense amp 230, and a global sense amp 240. The memory cells 210A and 210B are controlled by a word line 211. A local bit line 221A is connected to the memory cell 210A, and another bit line 221B is connected to another memory cell 210B, where the memory cell is composed of a pass transistor, a carbon nanotube storage element and a capacitor. Detailed circuit for the carbon nanotube memory cell will be shown as below (in FIG. 7E). The bit line is multi-divided for reducing bit line capacitance, such that the length of the bit line is shorter than that of conventional circuit. For instance, bit line loading is half, one-fourth or one-eighth, compared with the conventional memory. However, by dividing the bit line into short lines, more sense amps are required. Thus, each sense amp should be small enough for inserting between the divided memory arrays. And three-stage sense amp is used for reading the memory cell such that the left local sense amp 220A in the left hand side is connected to the local bit line 221A from the left hand side, and the right local sense amp 220B in the right hand side is connected to another memory cell 210B through another bit line 221B, the segment sense amp 230 is connected to the left local sense amp 220A and the right local sense amp 220B through a segment bit line 231, and the global sense amp 240 receives an output from one of the segment sense amp 230 through a global bit line 241.

The local sense amp 220A is composed of four transistors which configure a first dynamic circuit, wherein the local sense amp 220A includes a pre-charge transistor 222 for pre-charging the local bit line with pre-charge control signal 222A, a local amplify transistor 223 for amplifying a voltage output of the local bit line 221A, a local select transistor 224 for enabling the local amplify transistor with a select signal 224A, and a write transistor 225 for writing data input through a write bit line 246 with write control signal 225A. For matching pitch of the memory cells, the left local sense amp 220A is connected to the memory cell 210A from left hand side, and the right local sense amp 220B is connected to the memory cell 210B from right hand side.

The segment sense amp 230 is composed of three transistors which configure a second dynamic circuit, wherein the segment sense amp 230 includes a pre-set transistor 232 for pre-setting the segment bit line 231, a segment amplify transistor 233 for reading the segment bit line 231, and a segment select transistor 234 for enabling the segment amplify transistor 233.

The global sense amp 240 is composed of a write circuit 245 which is connected to a forwarding write line 201 serving as a forwarding write path, a read circuit including a reset transistor 242 for resetting the global bit line 241 and a first tri-state inverter 243 serving as an inverting amplifier, a bypass circuit including a second tri-state inverter 244 and a read inverter 252, and a returning buffer 265 for buffering a returning read line 264, so that the global sense amp occupies around two transistors per eight columns while total 17 transistors are used for configuring the global sense amp. And an output of the first tri-state inverter 243 is connected to a common node 251. And the second tri-state inverter 244 includes an input connecting to a forwarding write line 201 for bypassing previous block output, and an output connecting to the common node 251 for receiving a read output from the memory cell, such that the second tri-state inverter 244 is disabled by block select signals 250A (high) and 250B (low) for the selected memory block, while unselected tri-state inverter 261 in unselected memory block 260 is turned on to bypass an output from the previous block 200. The read inverter 252 transfers an inverted output of the common node 251 to a forwarding read line 253. And the forwarding read line 253 is connected to a returning read path including multiple inverting buffers, 261 and 262, and the returning buffer 263 and 265, wherein the returning buffer 265 is connected to the returning read line 264.

In order to reduce chip area, multiple memory cells are connected to one local sense amp through the local bit line, multiple local sense amps are connected to one segment sense amp through the segment bit line, and also multiple segment sense amps are connected to one global sense amp through the global bit line. In this manner, the first dynamic circuit serves as the local sense amp 220A which drives the segment bit line 231 as a capacitive load. And the second dynamic circuit serves as the segment sense amp 230 which drives the global bit line 241 as a capacitive load. The global sense amp 240 serves as a third sense amplifier which includes the first tri-state inverter 243 as the inverting amplifier for receiving the global bit line 241 and driving the (lightly loaded) common node 251 which is connected to the read inverter 252. And the read inverter is also connected to the second tri-state inverter 244 for bypassing an output from a previous memory block or a write data. Hence, there is no high peneration current when sensing with two dynamic circuits serving as the local sense amp, the segment sense amp, and the read tri-state inverter serving as the global sense amp, while the conventional differential amplifier as a sense amp wastes penetration current because pull-up transistor and pull-down transistor are simultaneously turned on until a sense amp output is developed to a full level.

For reading a stored data in the memory cell 210A, the left local sense amp 220A is released from pre-charge state, such that the local amplify transistor 223 is ready to amplify the bit line voltage 221A by turning off the pre-charge transistor 222 with pre-charge control signal 222A, when the local select transistor 224 is turned on by the select signal 224A but the write transistor 225 is turned off by the write control signal 225A. And the right local sense amp 220B is also released from pre-charge state. And then, the word line 211 is asserted to a predetermined voltage to activate the selected memory cell 210A and 210B for the open bit line memory cell array. Then, one of two local sense amps is selected by asserting the select signal. For example, the left local sense amp 220A is selected by asserting the select signal 224A, but the right local sense amp 220B is not selected. When the word line is rising, a storage node of the memory cell is coupled by the word line. By the coupling, the stored data may be changed when the coupling is high. In order to reduce the coupling, a (stacked) capacitor is added on the top of the carbon nanotube storage element, which does not require additional area. More detailed memory cell structure will be illustrated as below. And also the capacitor improves the read operation by charging or discharging the selected bit line after the word line is asserted, because the capacitor stores charges through the bended carbon nanotube. And when writing, the capacitor absorbs charges from unselected local bit line for unselected memory cells, which reduces disturbance. In contrast, a selected column receives write data, which changes the stored data or not. Furthermore, the capacitor in the memory cell enhances soft error immunity, such that the capacitor helps to keep the stored charges even though alpha ray or other ray hit the storage node.

When the memory cell stores data "1", the local bit line voltage is charged near VDD level (supply voltage) from pre-charged voltage VPRE (near half VDD level), because the storage node of the memory cell is contacted to VDD node through bended carbon nanotube. In contrast, when the memory cell stores data "0", the local bit line voltage is discharged near VSS (ground level) from the pre-charged voltage VPRE, because the storage node of the memory cell is contacted to VSS node through bended carbon nanotube. When reading, the position of the carbon nanotube is not changed, which realizes non-destructive read operation, because attracting forces are generated from the local bit line (pre-charged near half VDD voltage) to the carbon nanotube node which is contacted at VDD or VSS voltage, which does not require refresh operation. Furthermore, the position of the carbon nanotube is not changed after power is turned off, which realizes nonvolatile memory.

When the stored data is "1", the local bit line (LBL) 221A is quickly charged by the capacitor and the carbon nanotube storage element from pre-charged voltage (VPRE) toward VDD voltage, where VPRE voltage is near half VDD voltage. Thus, the local amplify transistor 223 is turned on by the local bit line 221A near VDD voltage. After then, the select transistor 224 is turned on by asserting the select signal 224A, so that the local amplify transistor 223 and the local select transistor 224 discharge the segment bit line 231. By discharging the segment bit line 231, a segment amplify transistor 233 in the segment sense amp 230 is turned on while the pre-set transistor 232 is turned off. By turning on the segment amplify transistor 233, the global bit line 241 is raised to VDD voltage from VSS ground voltage when the segment select transistor 234 is turned on but the reset transistor 242 is tuned off.

When the global bit line 241 is raised, the common node 251 is lowered near VSS voltage by the first tri-state inverter 243, while a block select signal 250A (high) and an inverted block select signal 250B (low) are asserted. Thus, the read inverter 252 receives an output from the first tri-state inverter 243. Then, the read output from the read inverter 252 is transferred to an output latch circuit 270 through the forwarding read line 253 and inverting buffers 261, 262, 263 and 265, while unselected tri-state inverter 261 in the unselected memory block 260 is turned on, in order to bypass the read output from the selected memory block 200.

In contrast, when the stored data is "0", the local bit line (BL) 221A is quickly discharged from pre-charged voltage (VPRE) to VSS voltage. Thereby the local amplify transistor 223 is turned off, which does not pull down the segment bit line 231. Thus the segment sense amp keeps turn-off state, and the global sense amp 240 keeps reset state. Hence, the read output is not changed, which is read data "0".

Particularly, in order to reduce turn-off current, the local amplify transistor 223 is composed of longer channel length transistor than that of the pre-set transistor 232 of the segment sense amp, the segment amplify transistor 233 is composed of longer channel length transistor than that of the reset transistor 242 of the global sense amp. Alternatively, the pre-charge transistor 222, the pre-set transistor 232 and the reset transistor 242 are composed of low threshold MOS transistor, such that the low threshold transistors keep the pre-charge state strongly with sub-threshold leakage current when reading data "0", because the segment bit line 231 and the global bit line 241 keep pre-charge state while the local amplify transistor 223 is turned off.

And a buffered data path is realized such that the buffered data path is composed of the forwarding write path and a returning read path, which realizes to reduce RC time constant and driving current, because data line is divided into short line while unselected portion of the data line is not discharging when writing. Furthermore, unselected portion of the data line is used as a read data line which is the forwarding read line 253. Thus, the forwarding read line 253 receives the read output from a memory cell through multi-stage sense amps. And the forwarding read line is buffered and connected to the output latch circuit 270 through the returning read line 264 and the returning buffer 265. With the returning read path, access time is almost same regardless of selected memory cell location, which realizes to latch the read output at a time with enough set-up and hold time even though a latch clock is fixed. When writing, the forwarding write line 201 serves as a write path, such that the (decoded) write circuit 245 including a NAND gate is enabled by the block select signal 250A (high) for receiving a data input from the forwarding write line 201. In doing so, the write bit line 246 is buffered to transfer the data input to the memory cell by the write circuit 245 and also the write bit line 246 is inverted for generating repelling force toward electrode in the carbon nanotube memory cell. During standby, the forwarding write line 201 keeps low for resetting the common node 251 to VDD voltage while the second tri-state inverter 244 is turned on, and all pre-charge signals and select signals are returned to pre-charge state. More detailed read operation and write operation will be explained as below.

The local amplify transistor 223 is stronger than the memory cell, and the segment amplify transistor 233 is much stronger than the local amplify transistor 223 with wide channel. Furthermore, the sense amp need not reference bit line because the sense amp does not compare voltage or current with reference bit line, but the sense amp detects whether the local amplify transistor 223 is turned on or not by the selected memory cell through the local bit line. Or the sense amp detects whether the local amplify transistor 223 is strongly or weakly turned on by the selected memory cell. Additionally, the local amplify transistor 223 and the segment amplify transistor 233 can include a low threshold MOS transistor, which achieves fast read operation for only high speed applications, even though turn-off current is increased. And the global sense amp 240 transfers the read output to the output latch circuit 270 through the read path. After then, the output latch circuit determines the read output whether the transferred data is "1" or "0" with a reference signal which is generated by data "1" because data "1" is reached to the output latch circuit early while data "0" is reached later. In this manner, the configuration of the memory block is simpler than the conventional sense amplifier using differential amplifier, while the conventional sense amplifier needs wide and long channel transistors for matching input transistors and load transistors in order to compensate device mismatch and process variation.

In the output latch circuit 270, the read output (data "1") changes the latch node 273 and output 278 to high from low through an AND gate 271 because the latch node 273 is pre-charged to low by NMOS 274 and the AND gate 271 with an inverter 279 which is controlled by latch control signal 279A. After then, the read output is stored in the latch node 273 with cross coupled inverters 275 and 276. And the output 278 changes NOR gate 281 to high, so that the transmission gate 272 is locked by signal 283 and 285 which are transferred from the output 278 through a tunable delay circuit 282 and inverter 284. Simultaneously, main data latch circuits 290 is also locked by the signal 283 and 285, where output latch circuit 290 is composed of same circuits as the output latch circuit 270. In doing so, the output 278 serves as a reference signal, which is generated by the reference memory cells, such as the memory cell 210A which store high voltage data in the storage node. Adding delay circuit 282, the reference signal serves as a locking signal, where the delay circuit is tunable for differentiating high voltage data and low voltage data, more effectively, because high voltage data is arrived earlier while low voltage data is arrived later or not arrived. Thus, one of two data is arrived earlier than the other data because of inversion state of the local amplify transistor 223, so that one data is referred to as fast data and the other data is referred to as slow data.

Thus, the output latch circuit 270 and the delay circuit 282 configure a latch control circuit 280, in order to generate the locking signal. More detailed delay circuit will be explained as below (in FIG. 5A). And the NOR gate 281 is used to generate the reference signal even though one of reference cells is failed, where more than one reference column is added for configuring the memory block even though the drawing illustrates only one reference memory column 200 including the output latch circuit 270. In this manner, fast data from the main memory block 291 is stored to the output latch circuit 290 before the locking signals 283 and 285 lock the latch, while slow data are not latched. Furthermore, the read access time is faster than that of the conventional memory, such that multi-divided bit line architecture is introduced in order to reduce the parasitic capacitance of local bit line. As a result, the sensing scheme including the locking signal is referred to as a "time-domain sensing scheme" with the multi-stage sense amps and the locking signal.

And during write operation, the write transfer gate 225 in the local sense amp 220A is turned on by asserting a write control signal 225A for overwriting data input through the decoded write circuit 245, such that the (inverting) write bit line 246 is forced to the local bit line 221A for generating attracting/repelling force, while the pre-charge transistor 222 and the local select transistor 224 keep turn-off state. For writing data "1", the write bit line is forced to VSS voltage, but the write bit line is forced to VDD voltage for writing data "0".

An aspect for the read and write operation is that the word line voltage affects the operation time, such that the word line for the selected memory cell is raised to higher than VDD+VT level in order to avoid NMOS threshold voltage drop, and the write control signal 225A is also raised to higher than VDD+VT level, where VT is threshold voltage. Hence the local bit line is quickly charged or discharged when reading data, which realizes fast access operation. During write operation, the word line and the write control signal also raised to higher than VDD+VT voltage to store full VDD voltage to the storage node when writing data "1", as alternative configuration. However, VDD voltage is still useful to configure with no level shifter circuits for driving the word line and write control signal, such that the carbon nanotube is attracted to one of VSS electrode and VDD electrode when writing data, because the carbon nanotube can not be placed in the middle region between VSS electrode and VDD electrode as long as there is a potential difference. When writing data, the carbon nanotube is attracted to VDD electrode or VSS electrode. After attracting, the carbon nanotube is contacted to electrode, which causes a current path. In order to reduce the current, long channel transistor can be used for the write transistor because long channel transistor flows less current typically, while the current path is setup through the long channel write transistor or series write transistors (shown 325 and 326 in FIG. 3A).

Figure 2B:
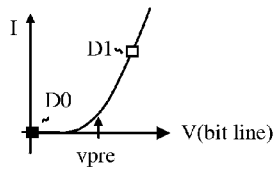
FIG. 2B illustrates an I-V curve of the local sense amp when reading.

Referring now to FIG. 2B in view of FIG. 2A, I-V curve of the local amplify transistor 223 is illustrated when reading. In order to read data from the memory cell, the pre-charge transistor 222 is turned off for releasing the local bit line 221A, and then the word line 211 is asserted to a predetermined voltage. When the memory cell 210A stores data "1" (D1 in FIG. 2B), the local bit line 221A is raised from pre-charge voltage VPRE voltage to VDD voltage. For instance, the local bit line 221A is raised from 0.5V to 1V, where the supply voltage is 1V, the pre-charged voltage is 0.5V and VT is 0.3V while the word line is raised to VDD+VT voltage. Thereby the local amplify transistor 223 is in saturation region, and the local amplify transistor 223 can flow current ID1 when the local select transistor 224 is enabled by asserting a local select signal (RD) 224A to high. On the contrary, when the memory cell 210A stores data "0" (D0 in FIG. 2B), the local bit line 221A is lowered from VPRE voltage to VSS voltage. For instance, the local bit line 221A is discharged from 0.5V to 0V. Thereby the local amplify transistor 223 is in sub-threshold region, and the local amplify transistor 223 can only flow leakage current ID0. At least several orders are different in current flow between ID1 (data "1") and ID0 (data "0").

Figure 2C:
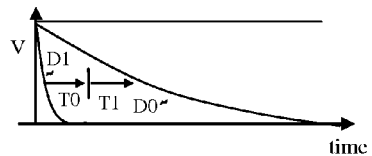
FIG. 2C illustrates discharge time of segment bit line.

Referring now to FIG. 2C in view of FIG. 2A, discharge time of the segment bit line 231 is illustrated. When reading data "1", the segment bit line 231 is quickly discharged by the local amplify transistor 223 as shown D1. On the contrary, the segment bit line 231 is floating but very slowly discharged by leakage current as shown D0, when reading data "0", so that the local amplify transistor 223 provides sub-threshold leakage current, which may very slowly turn on the segment amplify transistor 233. And, the segment amplify transistor 233 may pull up the global bit line 241 slowly. As a result, the first tri-state inverter as the inverting amplifier changes the common node to low, which causes a false flip. In order to avoid the false flip when reading data "0", the locking signal based on fast data (data "1") effectively rejects latching slow data (data "0"), such that the reference signal is generated by fast data (data "1") with delay time as shown T0, so that the timing margin T1 is defined to reject slow data (data "0"). Furthermore, in order to reduce turn-off current, the local amplify transistor 223 is composed of longer channel length transistor than that of the pre-set transistor 232, the segment amplify transistor 233 is composed of longer channel length transistor than that of the reset transistor 242 of the global sense amp. And alternatively, the pre-charge transistor of the local sense amp, the pre-set transistor for the segment sense amp and the reset transistor of the global sense amp are composed of low threshold MOS transistor, for sustaining the pre-charge state when reading data "0" with sub-threshold leakage current.

Figure 2D:
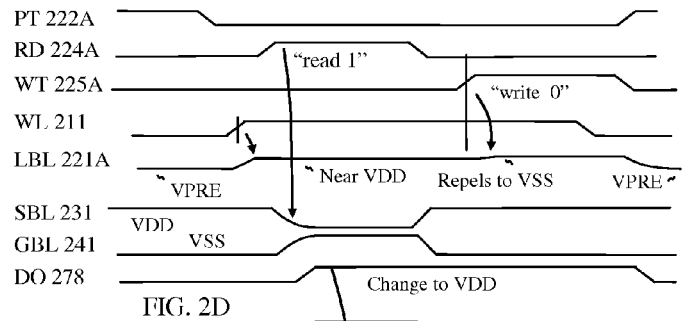
FIG. 2D illustrates reading data "1" and modifying data "0" timing diagram.

Referring now to FIG. 2D in view of FIG. 2A, detailed timing diagram for reading data "1" and modifying data "0" is illustrated. To read data, the pre-charge (PT) signal 222A is asserted to low, and the word line 211 is raised to a predetermined voltage. Hence the local bit line (BL) 221A is charged near VDD voltage from VPRE voltage by the memory cell 210A, which discharges the segment bit line 231 when the (read) select signal (RD) 224A is asserted to high. By discharging the segment bit line 231, the global bit line (GBL) 241 is pulled up near VDD voltage by the segment sense amp 230A. When the global bit line 241 is pulled up, the common node 251 is lowered by the first tri-state inverter 243. And By lowering the common node 251, the read inverter 252 transfers the change to output node (DO) 278 through the returning read line 264 and inverting buffers 261, 262, 263 and 265. After reading data, the write control signal 225A is asserted to high for modifying data but the (read) select signal 224A is de-asserted, which realizes read-modify-write operation as an example. By asserting the write control signal 225A, the local bit line is forced to VDD voltage for generating repelling force, so that the carbon nanotube is repelled by VDD electrode, and attracted to VSS electrode. As a result, the carbon nanotube is contacted to VSS electrode. After writing (modifying) data "0", all the control signals including the pre-charge (PT) signal 222A, the word line, and other control signals, are returned to pre-charge state or standby mode. Alternatively, write operation can be separately executed or read operation can be separately executed (not shown), for achieving fast cycle operation.

Figure 2E:
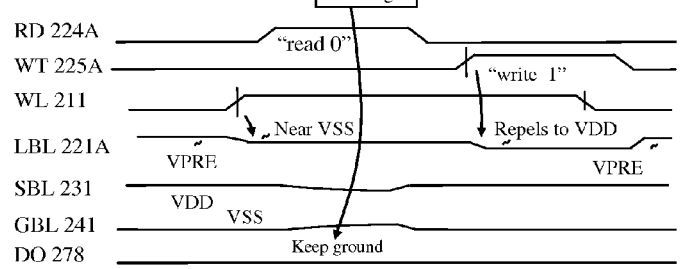
FIG. 2E illustrates reading data "0" and modifying data "1" timing diagram, according to the teachings of the present invention.

Referring now to FIG. 2E in view of FIG. 2A, detailed timing diagram for reading data "0" and modifying data "1" is illustrated, wherein the local amplify transistor 223 in the local sense amp 220A does not provide a current to the segment bit line 231 because the local bit line (BL) 221A is discharged near VSS voltage, which keeps the local amplify transistor in sub-threshold region. Thereby, the global bit line 241 keeps reset state. Thus the output (DO) 278 keeps low. However, the segment bit line (SBL) 231 may very slowly discharged by the turn-off current through the local sense amp, while the local bit line 221A is near VSS voltage. The turn-off current depends on transistor parameters, temperature and substrate voltage for the NMOS transistors. For reducing the turn-off current of the local amplify transistor, relatively long channel transistor can be used. And also the segment amplify transistor is composed of relatively long channel transistor. Furthermore, the pre-set transistor 232 and the reset transistor 242 are composed of low threshold transistor for sustaining the pre-set and reset state when reading data "0", as explained above. Additionally, in order to avoid the false flip with the turn-off current, the locking signal is generated, which rejects data "0" to be latched to the output latch circuit. After reading data "0", the write control signal 225A is asserted to high for writing data "1" while the (read) select signal 224A keeps low. By asserting the write control signal 225A, the local bit line is forced to VSS voltage for generating repelling force, so that the carbon nanotube is repelled by VSS electrode, and attracted to VDD electrode. As a result, the carbon nanotube is contacted to VDD electrode. After writing (modifying) data "1", all the control signals including the pre-charge (PT) signal 222A, the word line, and other control signals, are returned to pre-charge state or standby mode.

In this manner, the time-domain sensing scheme can differentiate high voltage data and low voltage data within a predetermined time domain. Thereby, data "1" is quickly reached to the data latch circuit, which generates a locking signal, but data "0" is very slowly transferred, thus the locking signal effectively rejects data "0" to be latched to the output latch circuit. In other words, fast cycle memory (with no page mode) does not require the locking signal which is generated by the reference signal based on reference cells storing data "1", because data "0" is not reached to the output latch circuit within a short cycle. Thus, an enable signal from a control circuit is used to control the data latch circuit, which does not require reference cells and related circuits. And by applying multi-divided bit line architecture, fast read operation and write operation are realized. And there are various modifications and alternatives for configuring the multi-stage sense amps, in order to read data from the memory cell through the multi-divided bit line.

Figure 3A:
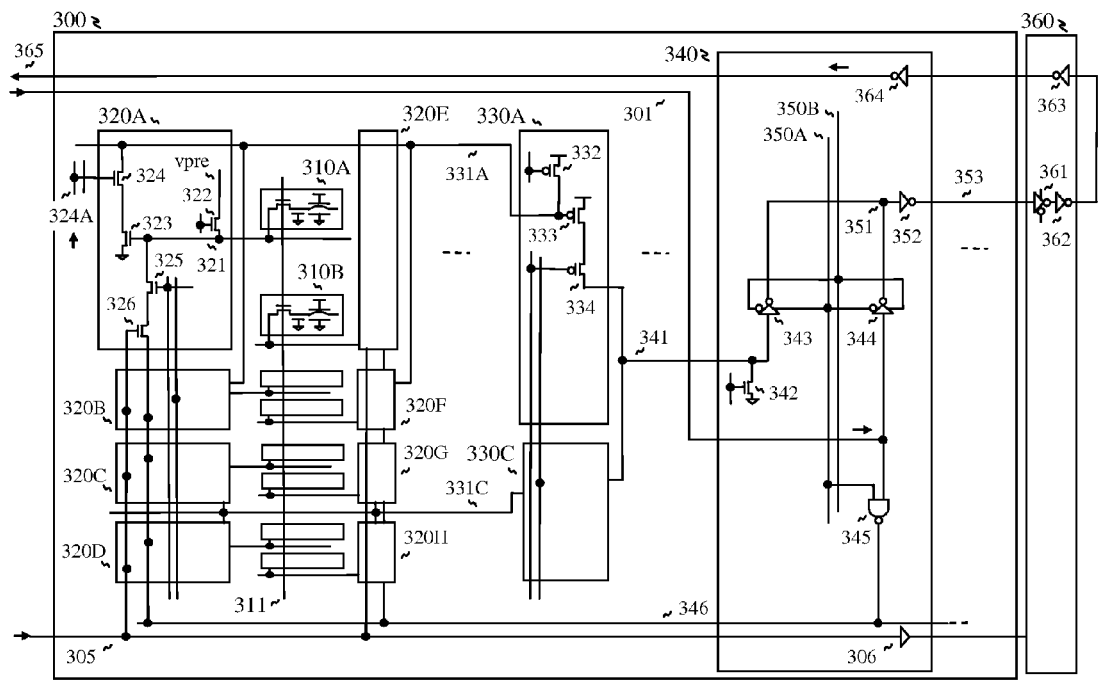
FIG. 3A illustrates a decoding scheme for the carbon nanotube memory as a main column.

In FIG. 3A, a decoding scheme for the carbon nanotube memory is illustrated, wherein a memory block 300 comprises left local sense amps 320A, 320B, 320C and 320D, right local sense amp 320E, 320F, 320G, and 320H, segment sense amps 330A and 330B, and a global sense amp 340. The memory cell 310A is connected to the left local sense amp 320A, another memory cell 310B is connected to the right local sense amp 320B, and other memory cells are connected to local sense amps, respectively. The memory cells are controlled by a word line 311. The local sense amps are connected to the segment sense amp, such that local sense amps 320A, 320B, 320E and 320F are connected the segment sense amp 330A through the segment bit line 331A, and local sense amps 320C, 320D, 320G and 320H are connected the segment sense amp 330C through the other segment bit line 331C. And two segment sense amps 330A and 330C are connected to the global sense amp 340 through the global bit line 341. A read output from the global sense amp 340 is transferred to next memory block 360 through the forwarding read line 353.

For implementing page mode write operation, two series connected transistors are used for writing data, where main column decoding is executed by a main write transistor 326 with main column select signal 305 in bit line direction, while sub column decoding is executed by the (sub) write transistor 325 as explained above with the write control signal in word line direction. For, example, the write transistor 325 is used for decoding one of eight columns and another write transistor 326 is used for decoding one of 32 columns. Hence, one of 256 columns can be decoded. When writing data, the write circuit 345 is enabled, and which circuit inverts the write data for generating repelling force and drives the write bit line 346. And the main column select signal 305 is buffered by a buffer circuit 306 for next memory block. In order to modify data only for selected column, write path needs main column decoding as explained above, while read path need not main column decoding because the read output is stored to the output latch circuit (270 in FIG. 2A) through the returning read path. After then, the stored data in the output latch circuit is selected for transferring to external port (not shown), which achieves fast page mode read operation.

When reading, eight memory cells are activated by the word line 311, and eight local sense amps are connected to eight memory cells, respectively. For example, local sense amp 320A reads the memory cell 310A, and the read output from the memory cell is transferred to the segment sense amp 330A, when the local select transistor 324 is turned on by asserting select enable signal 324A, but local sense amps 320B, 320E and 320F are not selected, because the select transistor of the local sense amp 320B, 320E and 320F keep low. Hence, one of four memory cells is selected and transferred to the segment sense amp 330A. Similarly, local sense amp 320C reads a memory cell, and the read output from the memory cell is transferred to the segment sense amp 330C, when the select transistor is turned on, but local sense amps 320D, 320G and 320H are not selected. And then, one of two segment sense amps 330A and 330B is selected by segment select signal, such that the segment sense amp 330A is selected by turning on segment select transistor 334 and a current path is set up through the segment amplify transistor 333 when the pre-set transistor 332 is turned off. As a result, the read output is transferred to the common node 351 by the first (read) tri-state inverter 343 and the global bit line 341, so that the common node 351 is pulled down while the reset transistor 342 is turned off. And the read output is transferred to data output node 365 through inverting buffers 352, 361, 362, 363 and 364, while the second (bypass) tri-state inverter 344 in the selected memory block is turned off by block select signals 350A (high) and 350B (low) but other tri-state inverter 361 in unselected memory block 360 is turned on.

Alternatively, for achieving very high speed operation, the segment sense amp 330A is connected to the local sense amp through a short length segment bit line for reducing parasitic loading of the local amplify transistor, and the source of the local amplify transistor 323 is connected to VPRE voltage (not shown) which is the same voltage as the pre-charge voltage of the local bit line 321, so that the local amplify transistor 323 is turned on only if the local bit line voltage is higher than VPRE+VT voltage. In doing so, no delay time is required for enabling the local select transistor 324 after the word line is turned on for measuring the stored voltage, such that the local amplify transistor 323 is guaranteed to detect the local bit line voltage without false detection, while this configuration needs more segment sense amps for realizing very high speed operation.

Figure 3B:
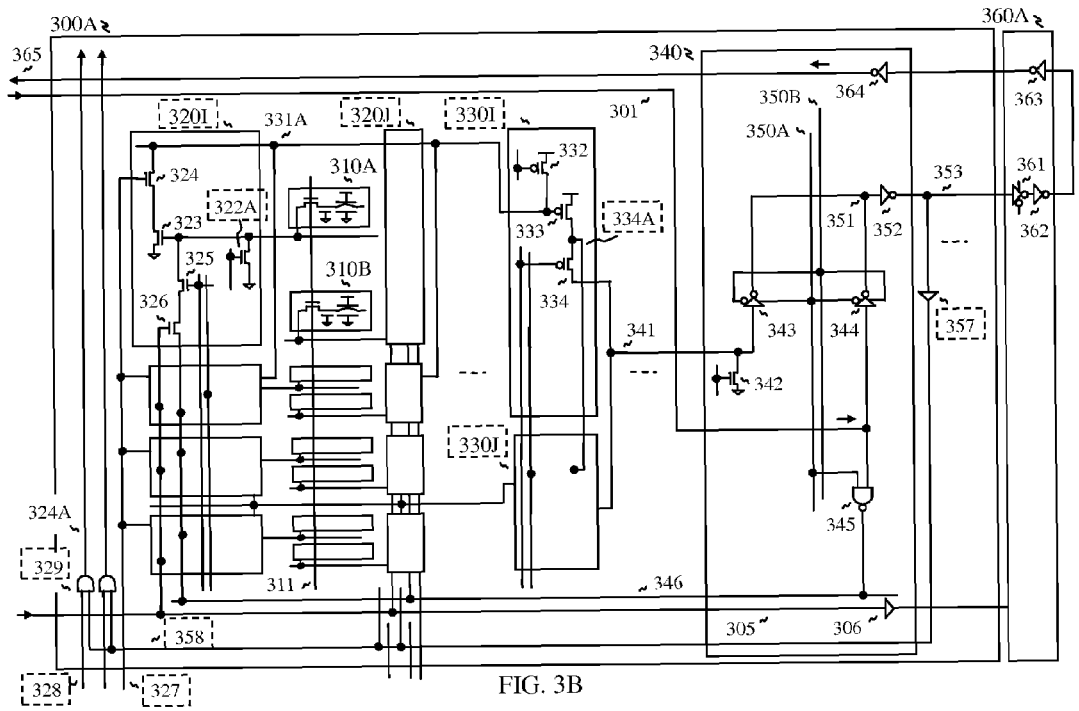
FIG. 3B illustrates a reference column for the carbon nanotube memory.

Referring now to FIG. 3B in view of FIG. 3A, a reference column for the carbon nanotube memory is illustrated, in order to generate the reference signal more effectively, wherein a memory block 300A comprises left local sense amps 320I, right local sense amp 320J, segment sense amps 330I and 330J, and a global sense amp 340. The local sense amp 320I is same as 320A of FIG. 3A including the local amplify transistor 323, the local select transistor 324 and the write transistors 325 and 326, but the pre-charge transistor 322A is connected to VSS voltage (instead of VPRE voltage) for pre-charging the (reference) local bit line 321 to VSS voltage for the reference column only, because the reference memory cells always store data "1". When reading, the local bit line is raised near VDD voltage from VSS voltage when the word line 311 is asserted, while the carbon nanotube is contacted to VDD electrode, which generates attracting force. By raising the local bit line, the segment bit line 331A is pulled down by the local sense amp, so that the segment sense amp 3301 is turned on and pulls up the global bit line 341. In particular, the global sense amp 341 is raised to VDD voltage, as long as one of two memory cells work correctly. For example, when the memory cell 310A is failed, the global bit line 341 works with another memory cell through segment sense amp 330J. To do so, a connection 334A is linked to the segment sense amp 330I and 330J.

Thus, the global bit line 341 is raised through the connection 334A, as long as one of two segment enable transistor (334 in 3301) is turned on, while the segment amplify transistor 333 is turned on but the pre-set transistor 332 is turned off. And then, the read output 353 of the global sense amp 340 is raised to VDD voltage, which output is transferred to AND gate 329 (in the left of the drawing) for starting the main local sense amp 320A in FIG. 3A with the select control signal 324A. For controlling the select transistor 324, a read start signal 327 is asserted to high first, which enables the reference local sense amp 320I. Hence, a reference signal 358 is generated by a buffer 357 receiving an output based on high data of a reference memory cell. And the reference signal 358 is used to enable the main local sense amps when the read enable signal 328 is asserted to high. And other circuits are same as FIG. 3A. Furthermore, the reference signal is used for generating the locking signal as explained above.

Figure 3C:
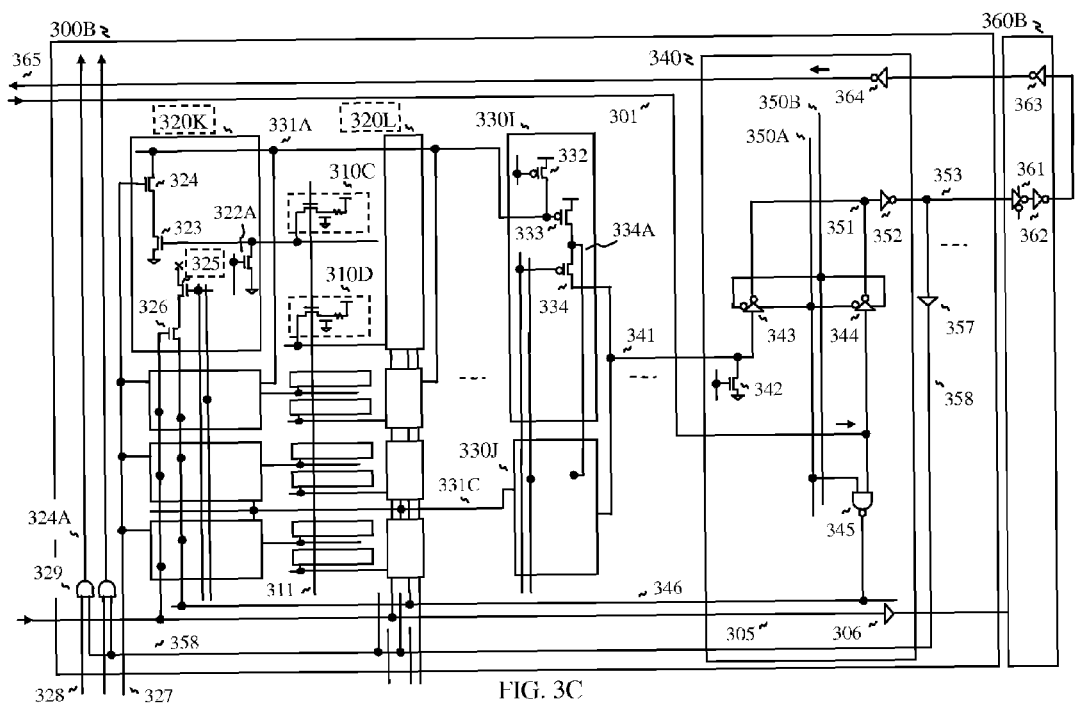
FIG. 3C illustrates an alternative reference column for the carbon nanotube memory, according to the teachings of the present invention.

Referring now to FIG. 3C in view of FIG. 3A, an alternative reference column for the carbon nanotube memory is illustrated, in order to generate the reference signal without the carbon nanotube. This is more useful at the beginning stage of the memory development because the reference signal is generated regardless of the carbon nanotube storage element works or not. The reference signal can be measured for checking the read path, for example. Thus, the reference memory cells 310C and 310D do not include carbon nanotubes. Instead of carbon nanotubes, the storage node is connected to VDD node through a resistor, and the capacitor is still connected to the storage node. And other circuits are the same as FIG. 3B, so that read operation is same, but write operation is not necessary, because the storage node is stuck to VDD node. Hence, the write transistor 325 is disconnected in the local sense amp 320K and 320L.

Figure 4:
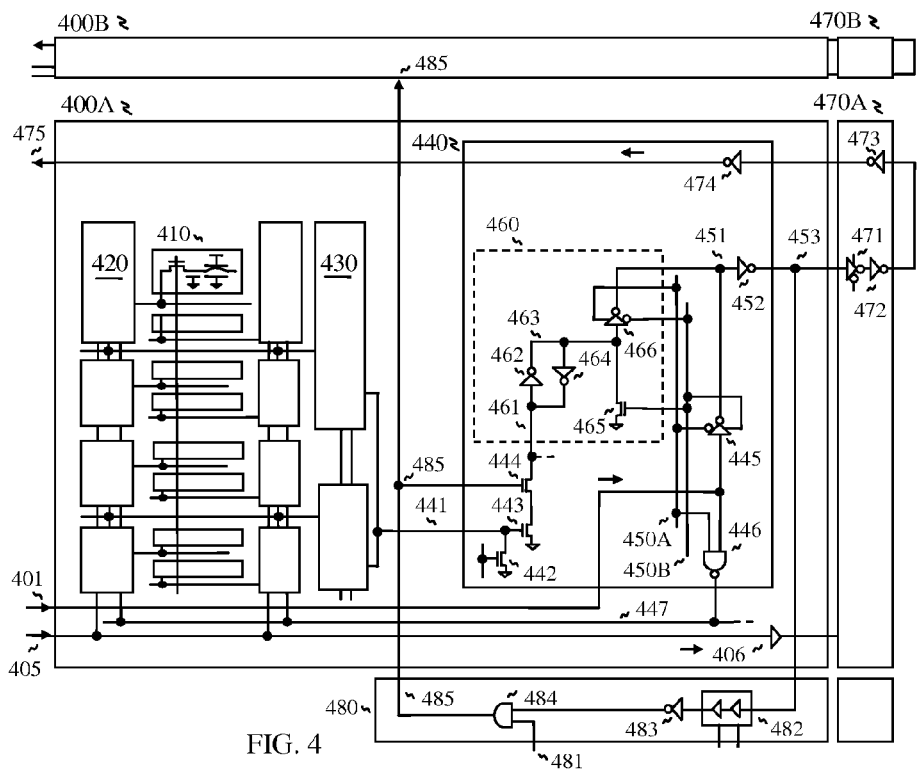
FIG. 4 illustrates alternative configuration including a latch circuit in a global sense amp, according to the teachings of the present invention.

In FIG. 4, alternative configuration including a latch circuit in the global sense amp, wherein the latch circuit 460 is composed of a cross coupled inverters 462 and 464 in the global sense amp 440 for storing an amplified output from the memory cell through the local sense amp and the segment sense amp. The latched data is transferred to a data output node 475 through a returning data path, so that the arriving time to the data output node is almost same regardless of location of the selected memory cell in row and column direction, which realizes very high density memory array. And this assumes that all the row decoders and the column decoders are also fully buffered for each block (not shown), such that the data path is fully buffered through the memory arrays.

Figure 5A:
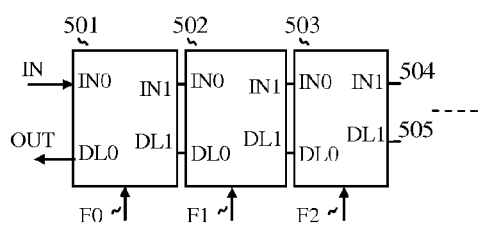
FIG. 5A illustrates a tunable delay circuit.

And a locking signal 485 is generated by the latched data as a reference signal with a tunable delay circuit 482 (circuit is shown in FIG. 5A), so that the locking signal locks all the latches before slow data are arrived. And delay time is optimized for compensating cell-to-cell and wafer-to-wafer variations as the similar manner in FIG. 2A. In doing so, very high density memory with low power consumption is realized, because only necessary portion of the returning data path is changing in order to save unnecessary charging/discharging current through the data path. And the write path is decoded, such that write data is reached to a selected block only while a tri-state inverter 445 blocks the write data to be sent to unselected memory block, which configures the buffered data path.

When reading, a stored data in a memory cell 410 is transferred to the (internal) latch 460 including two inverters 462 and 464 through local sense amp 420 and the segment sense amp 430. When the stored data is "1", an amplify transistor 443 in the global sense amp 440 is turned on by raising the global bit line 441, while the reset transistor 442 is turned off, but a read enable transistor 444 is turned on by the locking signal 485, because a read enable signal 481 is asserted to high, and an output of inverter 483 is at high before the read output of the read inverter 452 is changed from a pre-charge state (at low) through the forwarding read line 453. By turning on the amplify transistor 443, a latch node 461 is lowered, and another latch node 463 is raised to high from the pre-charged voltage while a latch reset transistor 465 connecting to the latch node 463 is turned off. Thus the common node 451 is lowered by the first tri-state inverter 466, while the second tri-state inverter 445 is turned off for the selected block by block select signal 450A (high) and 450B (low). By lowering the common node 451, the read inverter 452 transfers the change to the data output node 475 through the inverting buffers 471, 472, 473 and 474, when unselected tri-state inverter 471 in next memory block 470A is turned on to bypass the read output.

For realizing page mode write operation, the write bit line 447 is driven by the write circuit 446, wherein the write circuit 446 is enabled by the block select signal 450A (high). And the write transfer transistors (325 and 326 in FIG. 3) are also enabled to bypass an inverted write data through the write bit line 446, which generates repelling force between a carbon nanotube and one of two electrodes. When writing, the read enable signal 481 is de-asserted to low, so that the read enable transistor 444 is turned off.

Figure 5B:
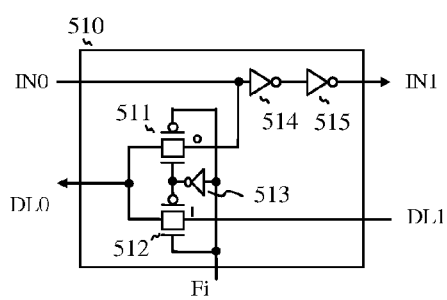
FIG. 5B illustrates a delay unit of the tunable delay circuit.

In FIG. 5A, more detailed a tunable delay circuit (as shown 282 in FIG. 2A) is illustrated, wherein multiple delay units 501, 502 and 503 are connected in series, the first delay unit 501 receives input IN and generates output OUT, the second delay unit 502 is connected to the first delay unit, and the third delay unit 503 is connected to the second delay unit 502 and generates outputs 504 and 505, and so on. Each delay unit receives a fuse signal, such that the first delay unit receives F0, the second delay unit receives F1, and the third delay unit receives F2. And more detailed delay unit is illustrated in FIG. 5B, wherein the delay unit 510 receives an input IN0 and a fuse signal Fi, thus the fuse signal Fi selects output from the input IN0 or input DL1, so that a transfer gate 511 is turned on when the fuse signal Fi is low and output of inverter 513 is high, otherwise another transfer gate 512 is turned on when the fuse signal Fi is high and output of inverter 513 is low to bypass DL1 signal. Inverter chain 514 and 515 delays IN0 signal for the next delay unit, where more inverter chains or capacitors can be added for the delay even though the drawing illustrates only two inverters.

Figure 5C:
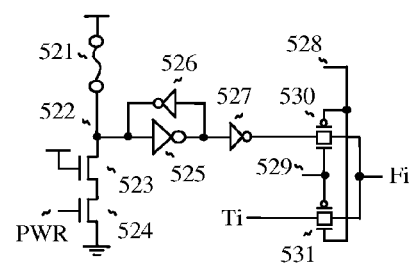
FIG. 5C illustrates a related fuse circuit of the tunable delay circuit, according to the teachings of the present invention.

In FIG. 5C, a related fuse circuit of the tunable delay circuit (as shown in FIG. 5A) is illustrated in order to store information for the delay circuit, so that a fuse serves as a nonvolatile memory, wherein a fuse 521 is connected to a latch node 522, a cross coupled latch including two inverters 525 and 526 are connected to the latch node 522, pull-down transistors 523 and 524 are serially connected to the latch node 522 for power-up reset. Transfer gate 530 is selected by a select signal 529 (high) and another select signal 528 (low) in order to bypass the latch node voltage 522 through inverter 525 and 527. In doing so, fuse data is transferred to output node Fi, otherwise test input Ti is transferred to Fi when a transmission gate 531 is turned on.

Figures 6A, 6B:
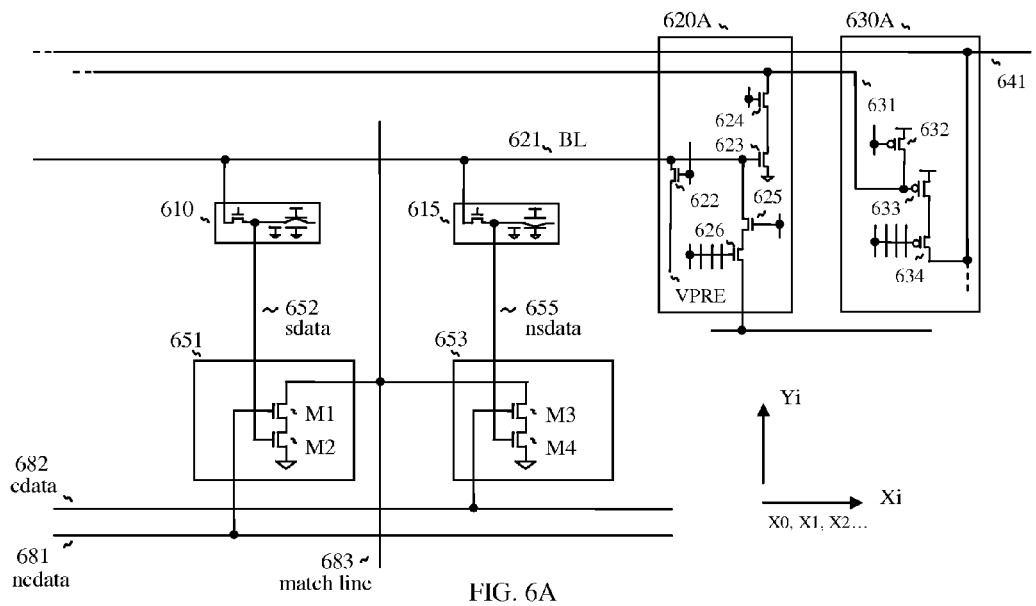
FIG. 6A illustrates an example application for configuring a content addressable memory.
FIG. 6B illustrates a truth table summarizing the logical relationships among various signals for the content addressable memory, according to the teachings of the present invention.

Additionally, in FIG. 6A, an example embodiment to implement CAM (content addressable memory) including the memory is illustrated. There are two memory cells 610 and 615, and two compare circuits 651 and 653 in a CAM cell. Read-write operation for the memory cells is the same as single port memory as explained above. And CAM operation is added in order to compare the stored data and the incoming data referred to as comparand. In detail, a CAM is a storage device that is particularly suitable for matching functions because it can be instructed to compare a specific pattern of comparand data with data stored in an associative CAM array. A CAM can include a number of data storage locations, each of which can be accessed by a corresponding address. Functionality of a CAM depends at least in part on whether the CAM includes binary or ternary CAM cells. Ternary CAM cells are mask-per-bit CAM cells that effectively store three states of information, namely a logic "1" state, a logic "0" state, and a don't care state for compare operations. Ternary CAM cells typically include a second memory cell that stores local mask data for the each ternary CAM cell. The local mask data masks the comparison result of the comparand data with the data stored in a first memory cell such that, when the mask bit has a first predetermined value (a logic "0", for example) its compare operation will be masked so that the comparison result does not affect the match line. The ternary CAM cell offers more flexibility to the user to determine on an entry-per-entry basis which bits in a word will be masked during a compare operation. However, the conventional SRAM cell based CAM is slow and big because transistors of the memory cell is wider than minimum feature size in order to drive heavy bit line during read, as published, U.S. Pat. No. 6,480, 406. Thus the carbon nanotube memory is useful for the CAM application, which realizes high-speed and high-density CAM.

The memory cells 610 and 615 store data in the storage nodes 652 and 655, respectively. Thus, the write data are stored in the storage nodes 652 and 655. The local bit line 621 is connected to the memory cells to write a data through write transistors 625 and 626 in the local sense amp 620A. And read portion of the local sense amp 620A is composed of the pre-charge transistor 622, local amplify transistor 623 and local select transistor 624. The segment sense amp 630A is composed of the pre-set transistor 632, the segment amplify transistor 633 and the segment select transistor 634 which is connected to the global bit line 641. Compare circuits 651 and 653 including NMOS transistors M1 and M2, M3 and M4 are connected to a match line 683 (ML) for comparing the stored data and the incoming data.

Referring now to FIG. 6B in view of FIG. 6A, a truth table is shown summarizing the behavior of CAM cell in relation to signal states maintained by various elements within CAM cell in accordance with the present invention, wherein the compare circuits are configured by the NMOS M1 to M4. Thus, the signal polarities of the internal nodes are non-inverted for controlling the match line ML 683. First column T21 lists binary states of "0" and "1" that can be stored in storage node 655 (namely nsdata) of the memory cell (CAM) cell) 615; second column T22 lists binary states of "0" and "1" that can be stored in storage node 652 (namely sdata) of the memory cell CAM) cell) 610. Third column T23 lists the ternary states that can be maintained in one of the complement compare data lines, namely cdata which is the signal 682. Fourth column T24 lists the ternary states that can be maintained in the other complement compare data line, namely ncdata which is the signal 681. Fifth column T25 lists "low" and "high" as the two available voltage levels for match line 683. Finally, sixth column T26 lists "match" and "mismatch" as the two possible results for comparing states of ncdata line 681 and cdata line 682 with the states of CAM cell.

Row T31 indicates masked case where sdata 652 and nsdata 655 are "0" which makes match line to stay the pre-charge level at logic high, regardless of the compare data, such that the stored data "0" has ground potential which turns off NMOS compare circuit M2 and M4, rows T32-T33 both indicate that "0" state of CAM cell is represented by "0" of memory cell 610, and "1" of memory cell 615. In row T32, because state "1" of cdata line 682 does not match state "0" of CAM cell (sdata 652), M3 and M4 set up a current path for the match line ML so that the match line ML is driven "low" to indicate a mismatch of the data key and the stored value of CAM cell. In row T33, because state "0" of cdata line 682 matches state "0" of CAM cell (sdata 652), match line ML is driven "high" to indicate a partial match of the comparand and the stored value of CAM.

Rows T34-T35 both indicate that "1" state of CAM cell is represented by "1" of memory cell 610 and "0" of memory cell 615. In row T34, because state "1" of cdata line 682 matches state "1" of CAM cell, match line 683 mL is driven "high" to indicate a partial match of the comparand and the stored value of CAM cell. In row T35, because state "0" of cdata line 682 does not match state "1" of CAM cell, M1 and M2 set up a current path for the match line ML, so that the match line ML is driven "low" to indicate a mismatch of the comparand and the stored value of CAM cell.

Methods of Fabrication

The memory cells can be formed from single crystal silicon on a wafer. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device on the wafer. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors An Efficient and Low-Cost Option for Digital Operation", IEEE Transactions on Electron Devices, Vol. 54, No. 11, November, 2007, and "A Novel Blocking Technology for Improving the Short-Channel Effects in Polycrystalline Silicon TFT Devices", IEEE Transactions on Electron Devices, Vol. 54, No. 12, December, 2007. During LTPS process, the MOS transistor in the control circuit and routing metal are not degraded. And the steps in the process flow should be compatible with the current CMOS manufacturing environment for forming carbon nanotube memories, such as U.S. Pat. No. 7,112,493, No. 7,017,023 and No. 6,969,651. And forming the thin film transistor is similar to forming TFT (thin film transistor) SRAM, as published, "A 256 Mb Synchronous-Burst DDR SRAM with Hierarchical Bit-Line Architecture for Mobile Applications", IEEE International Solid-State Conference, pp 476-477, 2005, and U.S. Pat. No. 6,670,642. In this respect, detailed manufacturing processes for forming the memory cell, such as width, length, thickness, temperature, forming method, or any other material related data, are not described in the present invention.

Figure 7C:
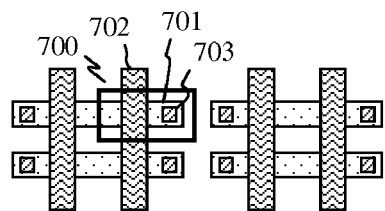
Figure 7C:
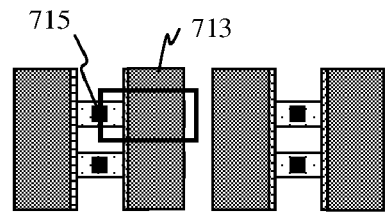
Figure 7B:
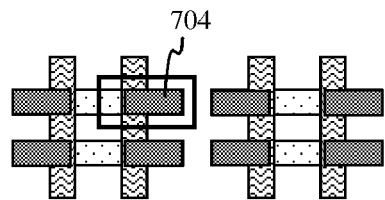
Figure 7D:
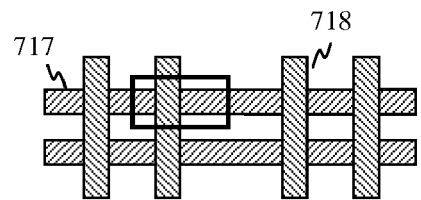

In FIGS. 7A, 7B, 7C and 7D, example layout for configuring an open bit line memory cell array is illustrated. A solid line 700 depicts a memory cell. In the process steps, active region 701 is formed first, and gate oxide is formed on the active region (not shown), then gate region 702 is formed on the gate oxide region. After then, contact region 703 is formed as shown in FIG. 7A, in order to connect the active region to the carbon nanotube storage element. And FIG. 7B shows a conduction layer 704 which is used as a plate to form a decoupling capacitor (as shown 905 in FIG. 9A), so that the decoupling capacitor reduces coupling noise. And the conduction layer 704 serving as a storage node is used for contacting the carbon nanotube (as shown 910 in FIG. 9A) through a contact region (909 in FIG. 9C). In FIG. 7C, top electrode region 713 (913 in FIG. 9F) is illustrated for forming the carbon nanotube storage element. More detailed structure is illustrated as below, shown in FIGS. 9A to 9F. And in FIG. 7D, a first metal layer 717 for the local bit line is formed on the contact region 715 in FIG. 7C. And, a second metal layer 718 for global word line is formed on the first metal layer 717. In this open bit line structure, one word line is used to control a memory cell with no passing word line, which makes a straight word line in shape. Hence, open bit line structure occupies 6F.sup.2 in general, which minimizes chip area. Furthermore, half of row decoders are reduced with no passing word line, which reduces chip area as well.

Figure 7E:
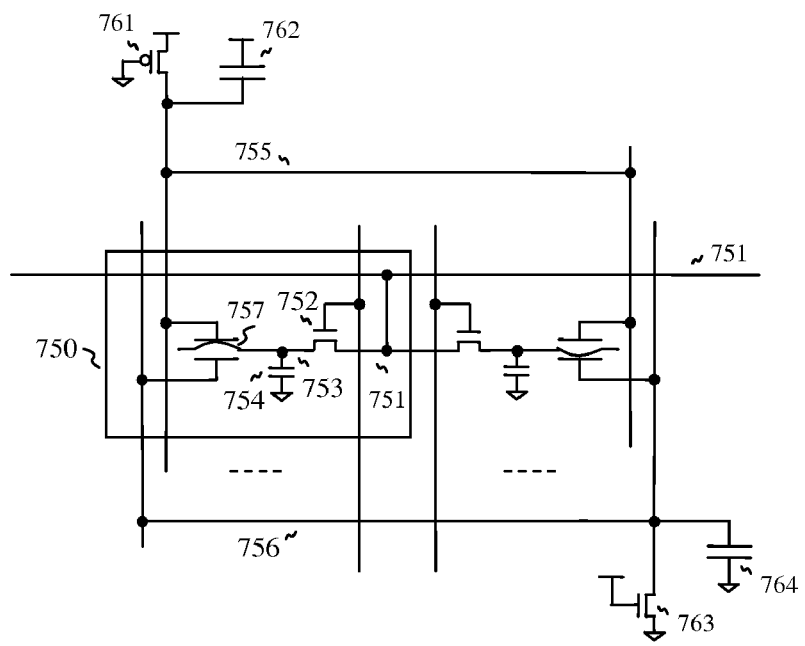
FIG. 7E illustrates detailed circuit for the carbon nanotube memory cell.

In FIG. 7E, detailed schematic for the carbon nanotube memory cell is illustrated, wherein the memory cell 750 includes a pass transistor (word line) 752 and a carbon nanotube (NT) 757. Alternatively, a decoupling capacitor 754 can be added for connecting to a storage node 753 of the carbon nanotube memory cell in order to reduce the coupling effect from the word line during read and write. Without the capacitor, the storage node of the memory cell is coupled by the gate of the pass transistor (word line). Alternatively, the capacitor is not added for simplifying the carbon nanotube storage element, which equally works with slight coupling noise. For storing data, the carbon nanotube 757 is attracted to bottom electrode 756 (connected to ground) or top electrode 755 (connected to power supply). And the memory cell 750 is connected to a bit line 751.

During write operation, the carbon nanotube 757 is contacted to one of two electrodes, so that a current path is set up after contacting. Thus, total contacting current is relatively high if the memory block is big, which may cause pattern sensitivity with IR drop of supply line. For example, the memory array includes 512 bit lines, and one of eight bit lines is selected and written by one of eight column decoding as explained above. Hence, 64 bit lines are written at a same time. Furthermore, more current will flow if there are more memory blocks. And this current is static current which may cause IR drop from supply node and ground node. In order to reduce high static current during write operation, two current limit transistors are added for the two electrodes, such that a PMOS current limit transistor 761 is added to the top electrode 755 and an NMOS current limit transistor 763 is added for the bottom electrode 756, where the current limit transistors are always turned on. Additionally, big reservoir capacitor is added to each electrode, such that a top reservoir capacitor 762 is added to the top electrode 755, and a bottom reservoir capacitor 764 is added to the bottom electrode 756. In doing so, the reservoir capacitors serve as a big charge source, which can provide instantaneous current with the stored charges. This operation is similar to a supply from a battery for a short time. And static current is limited by the current limit transistors, which reduces static power consumption and reduces data pattern sensitivity with less IR drop. And the reservoir capacitors and the current limit transistors are drawn in a cross section of row decoder and column decoder (not shown). Hence, no additional area is required.

And detailed array configuration is illustrated in FIG. 7F, wherein a memory cell 770A is connected to the local bit line 781 which is also connected to the local sense amp 780A to read a data from the memory cell with a word line 771, and another memory cell 770B is connected to the local bit line 781 which is connected to the local sense amp 780B to read data with the same word line 771. When reading data, only one word line 771, for example, is asserted to a predetermined voltage. Thus, the read output from the memory cell 770A is transferred to the segment sense amp 790 through the local sense amp 780A and the segment bit line 791, but another read output from the memory cell 780B is not selected. The other local sense amps 780C and 780D are not activated. The output of the segment sense amp 790 is transferred to a global sense amp (not shown) through the global bit line 792. And write operation is executed by a write bit line 793 when a write transistor (225 in FIG. 2A) is turned on in the local sense amp. And the read output is transferred to the output latch circuit (270 in FIG. 2A) through a read path including a returning read path 794.

In FIGS. 8A to 8C, example layout for the local sense amp is illustrated, wherein the local sense amp 820A (320A in FIG. 3) is placed next to memory cell 810 and another local sense amp 820B is placed next to the local sense amp 820A. The local sense amp 820A includes poly gate 822 as a precharge transistor, poly gate 823 as an local amplify transistor, poly gate 824 as a local select transistor, poly gate 825 and 826 as write transfer transistors. And poly gates configure transistors 822, 823, 824, 825 and 826 which are composed of n-type active region on p-well region 801. In addition, poly gate 824 is placed to adjacent poly gate 824', but the adjacent poly gate for next column is not touched to poly gate 824 with shifting. And metal-1 region and via-1 region are defined as shown in FIG. 8B, such that metal-1 bit line 821 is connected to drain region of the pre-charge transistor 822 and gate region of the local amplify transistor 823 in FIG. 8A. And, metal-1 region 805 is connected to poly gate 826, and metal-1 region 825A is used to connect the poly gate 825. And metal-1 831 serves as the segment bit line. Metal-1 layer 846 is used to connect write bit line.

And in FIG. 8C, metal-2 region is defined, such that VPRE voltage is provided to the pre-charge transistor, the write bit line 846 is connected to metal-1 region. In order to decode the write transfer transistor 825, four write control signals are defined as shown in FIG. 8C. For example, two of four write control signals are passing on the local sense amp 820A and other two write control signals are passing on another local sense amp 820B, so that metal-1 layer 825A in FIG. 8B is used for connecting and decoding the write transistor, which reduces metal lines. To share the write control signals with adjacent local sense amp, the pre-charge transistor 822 is released for both local sense amp 820A and 820B for preventing unnecessary current path during write, but the select transistor 824 is separately controlled for read operation in order to share the segment bit line 831. In doing so, one of eight column decoding is performed by four write control signals and transistor 825 with shared metal-2 lines. Furthermore, more decoding is executed, for example, one of 32 main-column decoding, by the write transfer transistor 826 with page select signal 805 in bit line direction (as shown 305 in FIG. 3), while the write transfer transistor 825 is decoded in word line direction which decodes one of eight sub-column decoding only. Read path decoding is executed by selecting local sense amp and segment sense amp as explained above. And the segment bit line 831 is also shared by adjacent column because one of two local sense amps is selected by local sense amp select signal 824A or 824B.

In FIG. 8D, an equivalent circuit including the local sense amp 820A and 820B is illustrated. The local sense amp 820A includes the write transistors 825 and 826 which are connected to write control signals 825A and 805 respectively, the pre-charge transistor 822, the local amplify transistor 823 which is connected to the local bit line 821, and the local select transistor 824 which selects the local amplify transistor with control signal 824A. The memory cell 810 is connected to the word line 811 and the local sense amp 820A through the local bit line 821. And an output of the local sense amp 820A is connected to the segment bit line 831, while unselected local sense amp 820B is illustrated with unselected control signal 824B, where the node numbers of the equivalent circuit as shown in FIG. 8D are the same as those of FIGS. 8A to 8C for ease of understanding.

Figure 9A:
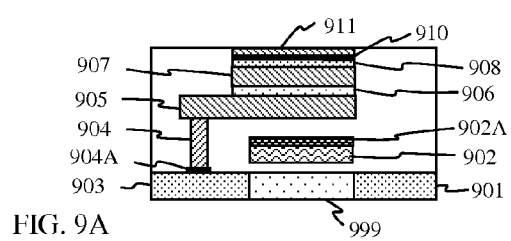
FIGS. 9A, 9B, 9C, 9D, 9E, and 9F illustrate a procedure to form the memory cell as an example, according to the teachings of the present invention.

In FIGS. 9A to 9F, process steps for forming the carbon nanotube memory cell are illustrated. A pass transistor is composed of drain region 901, source region 903, gate poly 902, and body 999. The gate poly 902 includes silicide region 902A which reduces sheet resistance, and the poly gate serves as a word line for the memory cell. After forming MOS pass transistor, contact region 904 is formed in order to connect a capacitor plate 905 through ohmic contact region 904A, so that a decoupling capacitor is composed of the capacitor plate 905 and a bottom electrode 907 of the carbon nanotube storage element with insulation layer 906, in order to reduce gate coupling. The insulation layer 906 for the decoupling capacitor is much thinner than thickness between the plate region 905 and gate (silicide) region 902A, which reduces coupling with the gate (word line). After patterning those layers, a first sacrificial layer 908 is formed on the bottom electrode 907. Then, carbon nanotube(s) 910 is arranged on the first sacrificial layer 908, and a first support layer 911 is formed and patterned on the carbon nanotube (NT) 910, as shown in FIG. 9A.

And various capacitors can be used as the decoupling capacitor for the memory cell to reduce coupling and also keep the stored charges, such that the capacitor structure includes PIP (Polysilicon-Insulator-Polysilicon) capacitor and MIM (Metal-Insulator-Metal) capacitor. Forming PIP capacitor and MIM capacitor is similar to the conventional method as published, "MIM Capacitor Integration for Mixed-Signal/RF Applications", IEEE Transactions on Electron Devices, Vol. 52, No. 7, June 2005. The capacitance value is determined by the thickness and insulation material. Furthermore, various dielectric materials can be used, such as silicon dioxide, silicon nitride, Ta2O5, TiO2, Al2O3, TiN/HfO2/TiN (TIT), and Ru/Insulator/TiN(RIT).

Figure 9D:
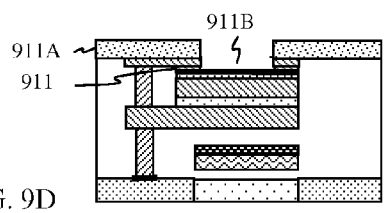
Figure 9B:
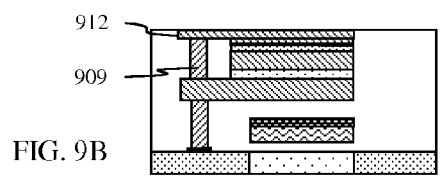

In FIG. 9B, a second support layer 912 is formed on the first support layer 911, and also the second support layer 912 is connected to the contact region 909 in order to connect the carbon nanotube to the pass transistor 902 through conduction layers. In FIG. 9C, the second support layer 912 is patterned by photo-resist layer 912A, such that the second support layer 912 is etched for the open region 912B. In FIG. 9D, the first support layer 911 is patterned by photo-resist layer 911A, such that the first support layer 911 is etched for the open region 911B. Alternatively, the second support layer 912 and the first support layer 911 are patterned at a time.

Figure 9E:
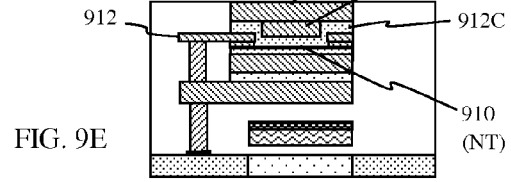
Figure 9C:
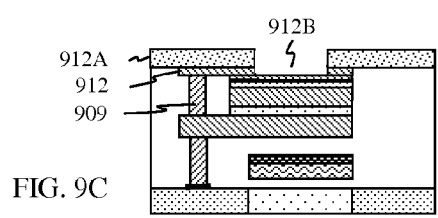
Figure 9F:
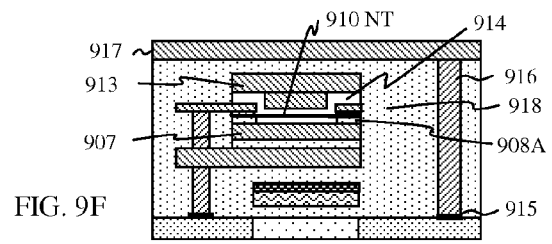

In FIG. 9E, top electrode 913A and 913 (connecting to, for example, VDD potential) is formed on a second sacrificial layer 912C. After forming top electrode 913A and 913, the sacrificial layer is etched in order to define a gap layer 914 (in FIG. 9F), where insulation layer 918 is formed after forming gap region. The preferred methods etch through porous carbon nanotube fabric layer without damaging carbon nanotube fibers by using appropriate techniques as prior arts, to expose region of sacrificial gap layer inside openings in conductors in contact with carbon nanotube fabric layer. Region of the sacrificial gap layer exposed to etch is removed and carbon nanotube fibers are suspended in the switching region. The sacrificial layer in FIG. 9E is removed using industry standard wet etches for Si3N4 (or silicon layer), for example. At this point a gap exists around a portion of the carbon nanotube 910. Carbon nanotube fibers remain mechanically pinned and electrically connected, sandwiched between top electrode 913 (and 913A) and bottom electrode 907. As a result, the carbon nanotube memory cell including gap region 914 is completed as shown in FIG. 9F, where the first sacrificial layer 908 is also removed but border region 908A is remained. And there are various methods to form the carbon nanotube storage element with minor modifications (not shown). After forming the carbon nanotube storage element, local bit line (metal) 917 is formed on the contact region 915 through conduction region 916.

Figure 10A:
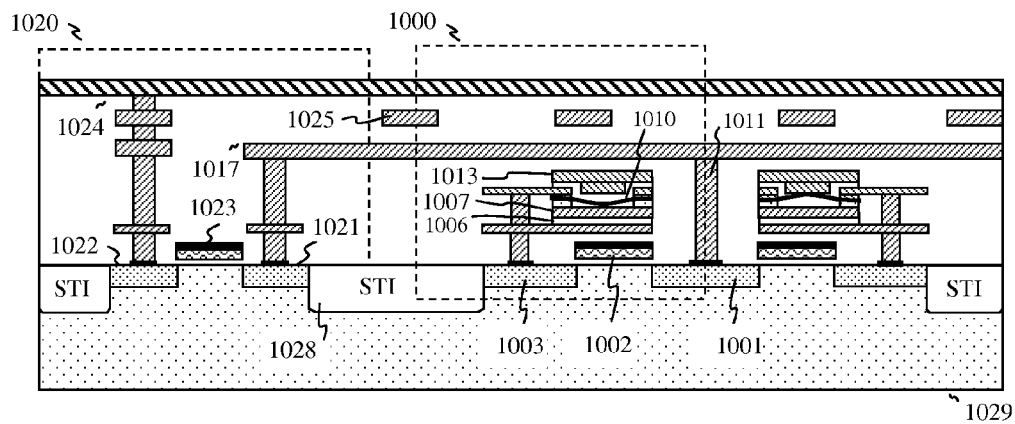
FIGS. 10A, 10B and 10C illustrate alternative memory cell structure for forming the carbon nanotube storage element and the capacitor, according to the teachings of the present invention.

In FIG. 10A, an example cross sectional view for the carbon nanotube memory cell 1000 and peripheral circuit 1020 is illustrated, wherein the memory cell structure is the same as shown in FIG. 9F, a carbon nanotube 1010 is bended to bottom plate 1007 or top plate 1013, and the carbon nanotube 1010 is connected to a drain/source region 1003 of the transfer gate 1002. And bit line 1017 is connected to a drain/source region 1001 of the transfer gate 1002 through deep bit line contact 1011, wherein the local bit line contact is directly connected to the drain/source region 1001 for reducing memory cell area. The memory cell data is transferred to local bit line 1017 which is connected to a write transistor 1023 through drain 1021. Then, drain 1022 of the write transistor 1023 is connected to write bit line 1024 on a global word line 1025. The peripheral circuit 1020 is placed on the same surface of a substrate 1029, where the memory cell area 1000 is isolated from the peripheral circuit region by STI (Shallow Trench Isolation) region 1028.

Figure 10B:
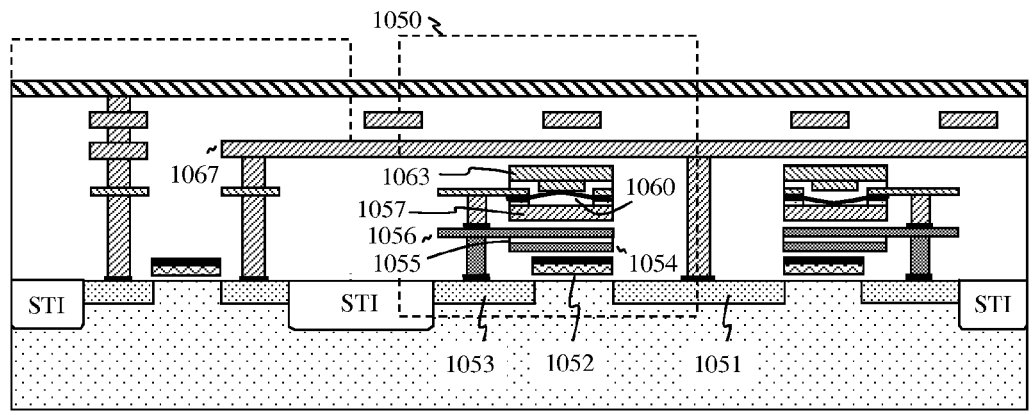

In FIG. 10B, alternative memory cell structure for forming the carbon nanotube storage element and the capacitor is illustrated. The storage node 1056 is formed on an insulation layer 1055 which is formed on a lower plate 1054. The plate 1054 can be formed from polysilicon or metal. And the structure of the carbon nanotube storage element is the same as shown in FIG. 9F, wherein the carbon nanotube 1060 is arranged between bottom plate 1057 and top plate 1063, and the carbon nanotube 1060 is connected to a drain/source region 1053 of the transfer gate 1052. And bit line 1067 is connected to a drain/source region 1051 of the transfer gate 1052. And other layers are same as FIG. 10A.

Figure 10C:
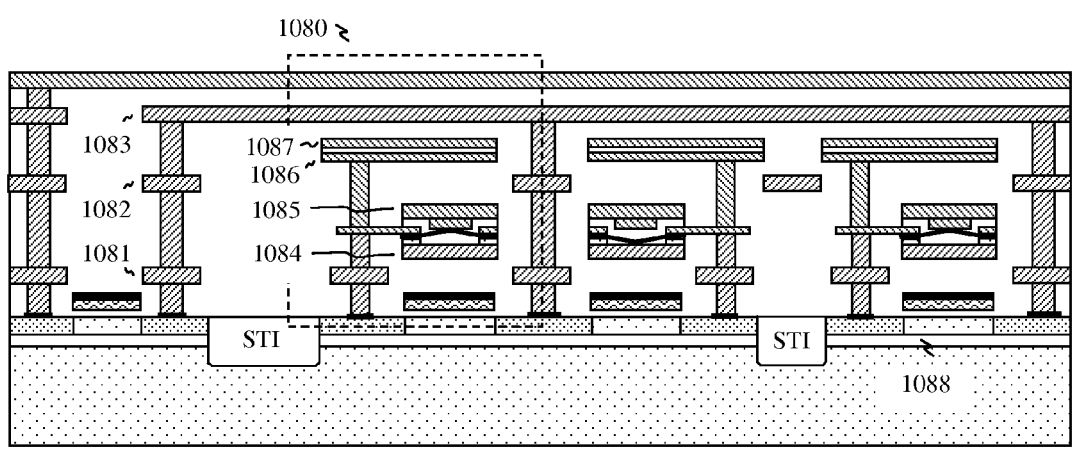

And In FIG. 10C, alternative memory cell structure for forming the carbon nanotube storage element 1080 and the capacitor on SOI (silicon on insulator) wafer 1089 is illustrated, wherein the carbon nanotube storage element including the bottom plate 1084 serves as a storage node and the top electrode 1085 is formed on the metal-1 layer 1081, then the metal-2 layer 1082 is formed. After forming the metal-2 layer, the capacitor including the first plate 1086 and the second plate 1087 is formed, and then the metal-3 layer is formed. Advantage of this configuration is that forming the carbon nanotube storage element and the capacitor does not affect to form the transistors and the routing layers with shallow contact depth, as long as low temperature process is used for forming the carbon nanotube storage element and the capacitor. And the structure of the carbon nanotube storage element is the same as shown in FIG. 9F, and transistors are formed on BOX (buried oxide) region 1088. Furthermore, the pass transistor of the memory cell is composed of longer channel length than that of peripheral circuits, in order to reduce sub-threshold leakage current.

Figure 11A:
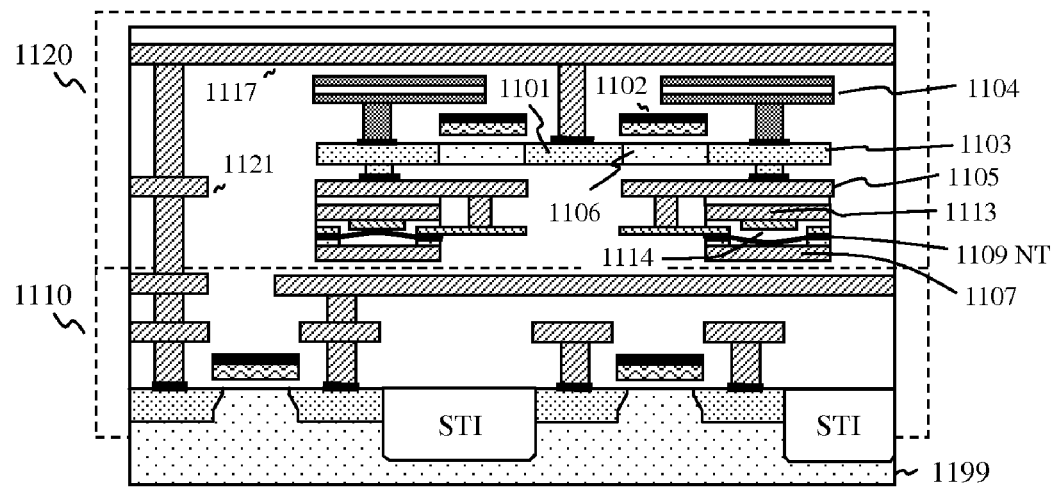
FIGS. 11A, 11B and 11C illustrate alternative memory cell structure for stacking the memory cells, according to the teachings of the present invention.

In FIG. 11A, alternative memory cell structure for forming storage element under the pass transistor of the memory cell is illustrated, wherein the peripheral circuit 1110 in the first floor is formed on the substrate 1199 and the memory cell 1120 in the second floor is stacked over the peripheral circuit 1110. In order to stack the memory cell over the peripheral circuit, LTPS (Low Temperature Polycrystalline Silicon) layer can be used, so that the peripheral circuits are not degraded while forming the memory cell. In particular, the carbon nanotube storage element is formed under the pass transistor, such that the carbon nanotube 1109 is arranged in the gap region 1114, and the gap region is formed in between bottom electrode 1107 and top electrode 1113. And the capacitor 1104 is separately formed on the pass transistor 1102, which is connected to source region 1103 of the pass gate 1102. Thus, drain 1101 of the pass transistor is connected to the local bit line 1117, and the local bit line is connected to the peripheral circuit 1110 through a metal region 1121 which is the same layer of the metal region 1105. And the thin film transistor including source/drain region 1101/1103 and body region 1106, serves as the pass transistor, such that the body of the pass transistor 1106 is floating. Furthermore the thin film transistor can be formed from various semiconductor materials, such as silicon-germanium and germanium.

Figure 11B:
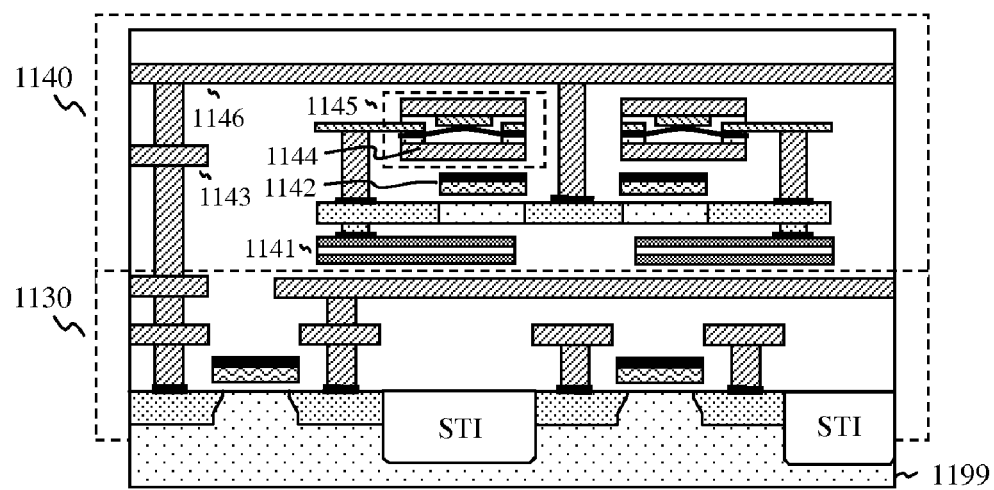

In FIG. 11B, alternative memory cell structure for forming the capacitor 1141 under the pass transistor 1142 of the memory cell is illustrated, wherein the peripheral circuit 1130 in the first floor is formed on the substrate 1199 and the memory cell 1140 in the second floor is stacked over the peripheral circuit 1130. The structure of the carbon nanotube storage element 1145 is the same as shown in FIG. 9F. After forming the carbon nanotube storage element, metal region 1146 is formed, and which is used for connecting metal region 1143. And the metal region 1143 is the same metal layer as bottom electrode layer 1144.

Figure 11C:
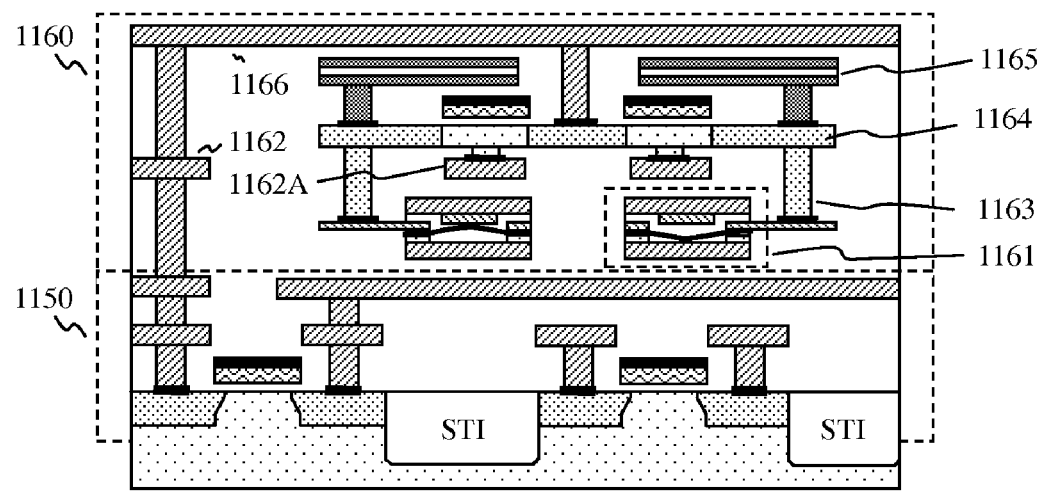

In FIG. 11C, alternative memory cell structure for forming storage element under the pass transistor with body-tied TFT is illustrated, wherein the peripheral circuit 1150 in the first floor is formed on the substrate region and the memory cell 1160 in the second floor is stacked over the peripheral circuit 1150. The structure of the carbon nanotube storage element 1161 is the same as shown in FIG. 9F. The capacitor 1165 is formed over drain region 1164 of the pass transistor. In particular, body of the pass transistor is connected to a bias voltage through metal region 1162A which is the same layer 1162 for connecting the local bit line 1166, so that the body of the pass transistor is always reverse biased, which alleviates self heating problem of the thin film transistor. This structure is more useful for short channel thin film transistor for reducing cell area. Furthermore, the sub-threshold leakage current is reduced by biasing the body. Alternatively, a negative voltage is biased for n-type pass transistor in order to reduce leakage current while the switching speed is slightly slow.

Figure 12A:
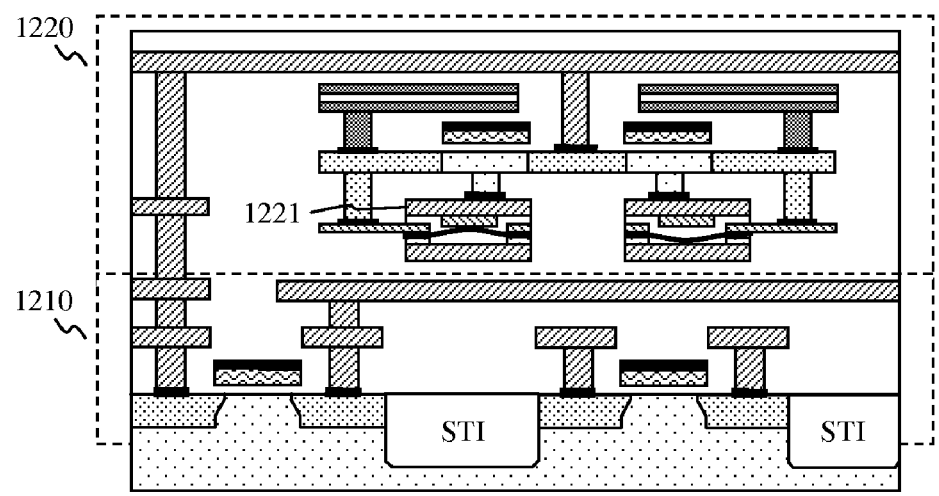
FIG. 12A illustrates alternative memory cell structure with body-tied TFT.

In FIG. 12A, alternative memory cell structure is illustrated for sharing the body biasing metal layer and top electrode metal layer, wherein metal layer 1121 is used for biasing the body of the pass transistor and also serving as the top electrode. The top electrode 1121 provides VSS voltage for NMOS pass transistor. The memory cell 1220 is formed on the peripheral circuit in the first floor 1210. And other layers are the same as FIG. 11C.

Figure 12B:
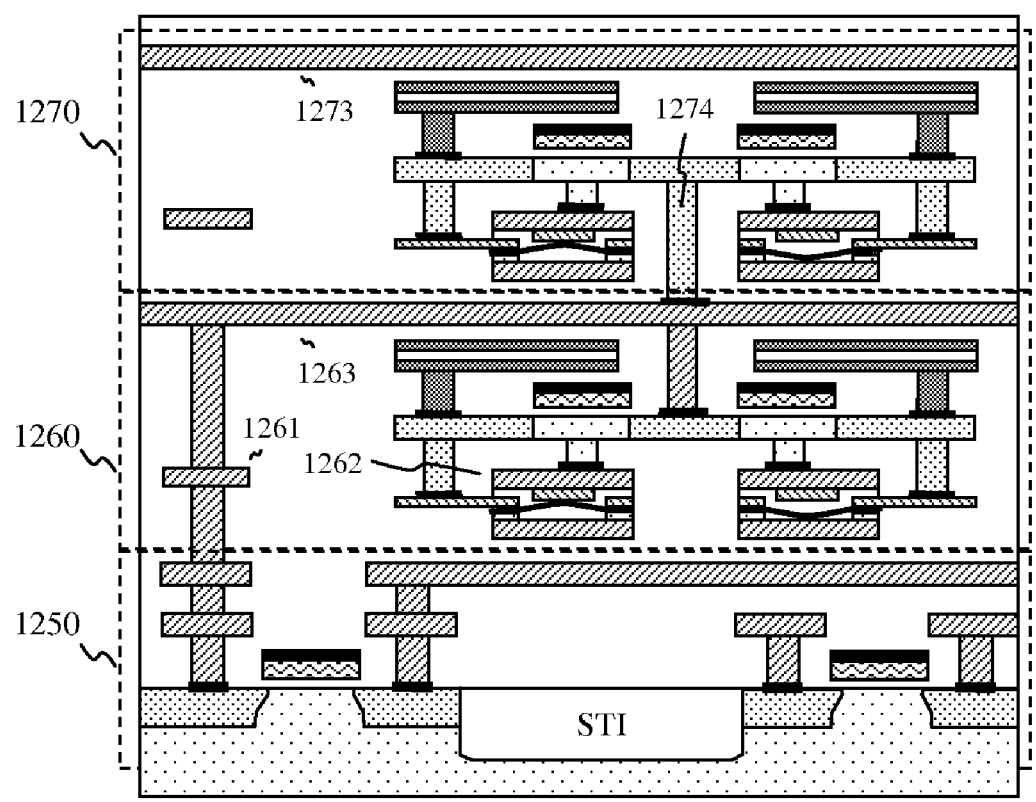
FIG. 12B illustrates alternative memory cell structure for stacking multiple memory cells with body-tied TFT, according to the teachings of the present invention.

In FIG. 12B, alternative memory cell structure for stacking multiple memory cells is illustrated, wherein the peripheral circuit 1250 in the first floor is formed on the substrate. The memory cell 1260 in the second floor is formed on the peripheral circuit 1250 and another memory cell 1270 in the third floor is formed on the second floor 1260. And the memory cell structure is same as FIG. 12A, such that the body is connected by metal region 1262 which is also used as the top electrode for the carbon nanotube storage element. And the metal region 1262 is the same layer as metal layer 1261 for connecting bit line 1263. In particular, the third floor memory cell 1270 is connected to the second floor memory cell 1260 through poly plug 1274, in order to reduce parasitic capacitance with metal bit line, while metal line 1273 on the third floor memory cell 1270 is used for other connections, such as write bit line.

While the carbon nanotube serves as the storage element, it has also been regarded as ideal interconnect for the chip. There are many reports to use carbon nanotube as the interconnection layer, as published. "Modeling of metallic carbon-nanotube interconnects for circuit simulations and a comparison with Cu interconnects for scaled technologies", Volume 25, Issue 1, January 2006 pp 58-65 IEEE Transactions on Computer-Aided Design of Integrated Circuits and Systems. And "Aligned carbon nanotubes for electrical interconnect and thermal management", Vol. 1 Page(s):44-50 ECTC "05 (Electronic Components and Technology Conference). In this respect, metallic carbon nanotube may be used for the routing lines, such as the word line, the bit line, and other control signals.

Still furthermore, the carbon nanotube can be useful vias for connecting the routing layers, as published, "Carbon nanotube vias for future LSI interconnects", 7-9 Jun. 2004 pp 251-253. Interconnect Technology Conference, 2004. And "Carbon nanotubes for interconnect applications", page(s):

683-686 IEDM 2004. Hence, metallic carbon nanotube may be used for the vias, such as the word line, the bit line, and other control signals.

While the descriptions here have been given for configuring the memory circuit and structure, alternative embodiments would work equally well with reverse connection such that PMOS transistor can be used as a pass transistor for configuring the memory cell, and signal polarities are also reversed to control the reverse configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
    a memory cell including a pass transistor, a capacitor, and a carbon nanotube storage element connecting to the pass transistor and the capacitor through a storage node, wherein the carbon nanotube storage element is composed of carbon nanotube(s) disposing in between a bottom electrode and a top electrode; and
    a first dynamic circuit as a local sense amp connecting to the memory cell through a local bit line, wherein the first dynamic circuit includes a pre-charge transistor for pre-charging the local bit line, a local amplify transistor for reading the local bit line where the local amplify transistor is serially connected to a local select transistor, and a write transistor connecting to the local bit line; and
    a second dynamic circuit as a segment sense amp connecting to the local select transistor through a segment bit line, wherein the segment sense amp is composed of a pre-set transistor for pre-setting the segment bit line, a segment amplify transistor for reading the segment bit line where the segment amplify transistor is serially connected to a segment select transistor; and
    a first tri-state inverter as an inverting amplifier of a global sense amp connecting to the segment select transistor through a global bit line, wherein the global sense amp includes a write circuit, a read circuit, a bypass circuit and a returning buffer, the write circuit is composed of a receiving gate for receiving a write data through a forwarding write line and driving a write bit line which is connected to the write transistor of the local sense amp; the read circuit is composed of the first tri-state inverter for reading the global bit line and a reset transistor for resetting the global bit line; the bypass circuit is composed of a second tri-state inverter for bypassing a voltage of the forwarding write line, and a read inverter for receiving an output from the first tri-state inverter or the second tri-state inverter through a common node, and the returning buffer for buffering a returning read line which receives a read output from the read inverter; and
    in order to reduce turn-off current, the local amplify transistor is composed of longer channel length transistor than that of the pre-set transistor of the segment sense amp, and the segment amplify transistor is composed of longer channel length transistor than that of the reset transistor of the global sense amp; and
    an output latch circuit receiving and storing an output from the returning buffer; and
    a latch control circuit generating a locking signal which is generated by a reference signal based on at least a reference memory cell, in order to lock the output latch circuit.

2. The memory device of claim 1, wherein the pre-charge transistor of the local sense amp, the pre-set transistor of the segment sense amp and the reset transistor of the global sense amp are composed of low threshold MOS transistor.

3. The memory device of claim 1, wherein the local sense amp includes two series connected transistors for serving as a write switch for writing data to the memory cell through the local bit line, the pre-charge transistor for pre-charging the local bit line, and the local amplify transistor for reading the local bit line where the local amplify transistor is serially connected to the local select transistor.

4. The memory device of claim 1, wherein the read circuit is composed of a global amplify circuit, a latch circuit and the first tri-state inverter, such that the global amplify circuit includes a global amplify transistor for reading the global bit line and the reset transistor for resetting the global bit line, and a global select transistor for enabling the global amplify transistor; the latch circuit is connected to the global select transistor; the first tri-state inverter includes an input which is connected to the latch circuit and an output which is connected to the read inverter of the bypass circuit through the common node; and the latch circuit is reset by a latch reset transistor.

5. The memory device of claim 1, wherein the read circuit is composed of a global amplify circuit, a latch circuit and the first tri-state inverter, such that the global amplify circuit includes a global amplify transistor for reading the global bit line and the reset transistor for resetting the global bit line, and a global select transistor for enabling the global amplify transistor; the latch circuit is connected to the global select transistor; the first tri-state inverter includes an input which is connected to the latch circuit and an output which is connected to the read inverter of the bypass circuit through the common node; and the latch circuit is reset by a latch reset transistor; and the global select transistor is controlled by the locking signal which is generated by a tunable delay circuit receiving the read output of the read inverter.

6. The memory device of claim 1, wherein the latch control circuit receives a read enable signal from a control circuit and generates the locking signal to lock the output latch circuit.

7. The memory device of claim 1, wherein the latch control circuit includes a tunable delay circuit, such that the tunable delay circuit receives multiple reference signals which are generated by multiple reference memory cells; and the tunable delay circuit generates the locking signal by delaying at least one reference signal from the multiple reference signals; and tuning information for the tunable delay circuit is stored in a nonvolatile memory.

8. The memory device of claim 1, wherein the local bit line connecting to the local sense amp is pre-charged near half of supply voltage.

9. The memory device of claim 1, wherein the pass transistor of the memory cell is composed of longer channel length transistor than that of peripheral circuits.

10. The memory device of claim 1, wherein the pass transistor of the memory cell is formed from a thin film transistor and a body of the thin film transistor is connected to a biasing line.

11. The memory device of claim 1, wherein the pass transistor of the memory cell is controlled by a word line which has two states, where one of the two states is higher than supply voltage.

12. The memory device of claim 1, wherein the pass transistor of the memory cell is controlled by a word line which has a straight line for configuring an open bit line memory cell array.

13. The memory device of claim 1, wherein the pass transistor of the memory cell is formed from various materials, such as single crystalline silicon, poly crystalline silicon, silicon-germanium, and germanium.

14. The memory device of claim 1, wherein the capacitor of the memory cell includes multiple layer capacitor, such as PIP (polysilicon-insulator-polysilicon) capacitor and MIM (metal-insulator-metal) capacitor.

15. The memory device of claim 1, wherein the capacitor of the memory cell is formed from various dielectric material, such as silicon dioxide, silicon nitride, Ta2O5, TiO2, Al2O3, TiN/HfO2/TiN(TIT), and Ru/Insulator/TiN(RIT).

16. The memory device of claim 1, wherein the memory cell includes the pass transistor and the carbon nanotube storage element with no capacitor.

17. The memory device of claim 1, wherein the carbon nanotube storage element includes carbon nanotube(s) which is disposed in between the bottom electrode and the top electrode; and the top electrode is connected to a current limit transistor and a charge reservoir capacitor, and the bottom electrode is connected to another current limit transistor and another charge reservoir capacitor.

18. The memory device of claim 1, wherein the memory cell is stacked over peripheral circuits.

19. The memory device of claim 1, wherein the memory cell is stacked over another memory cell.

20. The memory device of claim 1, additionally comprising at least one compare circuit to configure a content addressable memory; and the compare circuit includes a first transistor set and a second transistor set, wherein a first signal set couples to control a conduction state of the first transistor set and a second signal set couples to control a conduction state of the second transistor set, wherein the first signal set includes stored data in the memory cell and the second signal set includes comparand data from an input device; and at least one compare circuit coupled among the memory cells and at least one match line to receive the first and second signal sets and affect a logical state of the match line, in response to a predetermined logical relationship between the first and second signal sets.

* * * * *